United States Patent
Seo et al.

(10) Patent No.: US 10,134,996 B2
(45) Date of Patent: Nov. 20, 2018

(54) COMPOSITE MATERIAL, LIGHT-EMITTING ELEMENT, LIGHT-EMITTING DEVICE, AND MANUFACTURING METHOD THEREOF

(71) Applicant: Semiconductor Energy Laboratory Co., Ltd., Kanagawa-ken (JP)

(72) Inventors: Satoshi Seo, Kanagawa (JP); Harue Nakashima, Kanagawa (JP); Ryoji Nomura, Kanagawa (JP); Satoko Shitagaki, Kanagawa (JP)

(73) Assignee: Semicondcutor Energy Laboratory Co., Ltd. (JP)

( * ) Notice: Subject to any disclaimer, the term of this patent is extended or adjusted under 35 U.S.C. 154(b) by 1016 days.

(21) Appl. No.: 13/970,092

(22) Filed: Aug. 19, 2013

(65) Prior Publication Data
US 2013/0341608 A1 Dec. 26, 2013

Related U.S. Application Data

(62) Division of application No. 11/666,196, filed as application No. PCT/JP2005/019848 on Oct. 24, 2005, now abandoned.

(30) Foreign Application Priority Data

Oct. 29, 2004 (JP) .................................. 2004-317333

(51) Int. Cl.
*H01L 51/00* (2006.01)
*C09K 11/06* (2006.01)
*H01L 51/50* (2006.01)

(52) U.S. Cl.
CPC .......... *H01L 51/0051* (2013.01); *C09K 11/06* (2013.01); *H01L 51/0059* (2013.01);
(Continued)

(58) Field of Classification Search
None
See application file for complete search history.

(56) References Cited

U.S. PATENT DOCUMENTS 4,247,597 A 1/1981 Russell, Jr.
4,362,510 A 12/1982 Brauer et al.
(Continued)

FOREIGN PATENT DOCUMENTS

CN 1327360 A 12/2001
CN 1427001 A 7/2003
(Continued)

OTHER PUBLICATIONS

Machine English translation of JP 11-204260 A. Nov. 25, 2016.*
(Continued)

*Primary Examiner* — Jay Yang
(74) *Attorney, Agent, or Firm* — Husch Blackwell LLP

(57) ABSTRACT

It is an object of the present invention to provide a composite material that can be used for manufacturing a heat-resistant light-emitting element, provide a composite material that can be used for manufacturing a heat-resistant light-emitting element that can be driven with stability for a long period of time, and further, provide a composite material that can be used for manufacturing a light-emitting element that easily prevents short circuit between electrodes and uses less power. The present invention provides a composite material that has a first metal oxide skeleton including a first metal atom and an organic compound that is bound to the first metal atom by forming a chelate, where the first metal oxide exhibits an electron accepting property to the organic compound.

21 Claims, 16 Drawing Sheets

(52) U.S. Cl.
CPC ...... *H01L 51/0072* (2013.01); *H01L 51/0077* (2013.01); *H01L 51/0079* (2013.01); *H01L 51/5048* (2013.01); *C09K 2211/1007* (2013.01); *C09K 2211/1011* (2013.01); *C09K 2211/1014* (2013.01); *C09K 2211/1029* (2013.01); *C09K 2211/1033* (2013.01); *C09K 2211/1037* (2013.01); *C09K 2211/1044* (2013.01); *C09K 2211/1048* (2013.01); *C09K 2211/1051* (2013.01); *C09K 2211/183* (2013.01); *C09K 2211/186* (2013.01); *H01L 51/007* (2013.01); *H01L 51/0067* (2013.01); *H01L 51/0069* (2013.01); *H01L 51/0071* (2013.01)

(56) References Cited

U.S. PATENT DOCUMENTS

| | | | |
|---|---|---|---|
| 4,392,968 A | 7/1983 | Ishida et al. | |
| 4,563,300 A | 1/1986 | Wynne et al. | |
| 4,563,301 A | 1/1986 | Marks et al. | |
| 4,622,170 A | 11/1986 | Wynne et al. | |
| 4,839,112 A | 6/1989 | Wynne et al. | |
| 5,318,628 A | 6/1994 | Matijevic et al. | |
| 5,404,075 A | 4/1995 | Fujikawa et al. | |
| 5,432,014 A | 7/1995 | Sano et al. | |
| 5,466,392 A | 11/1995 | Hironaka et al. | |
| 5,635,249 A | 6/1997 | Haluska et al. | |
| 5,703,436 A | 12/1997 | Forrest et al. | |
| 5,834,100 A | 11/1998 | Marks et al. | |
| 5,843,591 A | 12/1998 | Oishi et al. | |
| 5,989,737 A | 11/1999 | Xie et al. | |
| 6,013,384 A | 1/2000 | Kido et al. | |
| 6,380,687 B1 | 4/2002 | Yamazaki | |
| 6,423,429 B2 | 7/2002 | Kido et al. | |
| 6,483,236 B1 | 11/2002 | Hung | |
| 6,486,601 B1 | 11/2002 | Sakai et al. | |
| 6,489,638 B2 | 12/2002 | Seo et al. | |
| 6,517,958 B1 | 2/2003 | Sellinger et al. | |
| 6,518,700 B1 | 2/2003 | Friend et al. | |
| 6,552,496 B2 | 4/2003 | Yamazaki | |
| 6,573,650 B2 | 6/2003 | Aoki et al. | |
| 6,586,763 B2 | 7/2003 | Marks et al. | |
| 6,589,673 B1 | 7/2003 | Kido et al. | |
| 6,593,691 B2 | 7/2003 | Nishi et al. | |
| 6,608,449 B2 | 8/2003 | Fukunaga | |
| 6,614,176 B2 | 9/2003 | Kim et al. | |
| 6,642,544 B1 | 11/2003 | Hamada et al. | |
| 6,650,047 B2 | 11/2003 | Aoki et al. | |
| 6,690,033 B2 | 2/2004 | Yamazaki et al. | |
| 6,692,845 B2 | 2/2004 | Maruyama et al. | |
| 6,717,358 B1 | 4/2004 | Liao et al. | |
| 6,720,092 B2 | 4/2004 | Hatwar | |
| 6,764,776 B2 | 7/2004 | Seo | |
| 6,765,349 B2 | 7/2004 | Liao et al. | |
| 6,774,573 B2 | 8/2004 | Yamazaki | |
| 6,794,278 B2 | 9/2004 | Kido et al. | |
| 6,830,494 B1 | 12/2004 | Yamazaki et al. | |
| 6,876,144 B2 | 4/2005 | Peng | |
| 6,939,625 B2 | 9/2005 | Marks et al. | |
| 6,958,490 B2 | 10/2005 | Okamoto et al. | |
| 7,074,500 B2 | 7/2006 | Pfeiffer et al. | |
| 7,141,817 B2 | 11/2006 | Nishi et al. | |
| 7,158,161 B2 | 1/2007 | Gyoutoku et al. | |
| 7,230,107 B1 | 6/2007 | Herron et al. | |
| 7,256,422 B2 | 8/2007 | Yamazaki | |
| 7,273,663 B2 | 9/2007 | Liao et al. | |
| 7,323,225 B2 | 1/2008 | Aoki et al. | |
| 7,365,486 B2 | 4/2008 | Lee et al. | |
| 7,449,509 B2 | 11/2008 | Marks et al. | |
| 7,517,470 B2 | 4/2009 | Seo et al. | |
| 7,732,808 B2 | 6/2010 | Ikeda et al. | |
| 2001/0004190 A1 | 6/2001 | Nishi et al. | |
| 2001/0025959 A1 | 10/2001 | Yamazaki et al. | |
| 2001/0041270 A1 | 11/2001 | Maruyama et al. | |
| 2001/0043046 A1 | 11/2001 | Fukunaga | |
| 2001/0046611 A1 | 11/2001 | Kido et al. | |
| 2001/0053559 A1 | 12/2001 | Nagao et al. | |
| 2002/0093290 A1 | 7/2002 | Yamazaki | |
| 2002/0101154 A1 | 8/2002 | Seo et al. | |
| 2002/0105005 A1 | 8/2002 | Seo et al. | |
| 2002/0109136 A1 | 8/2002 | Seo et al. | |
| 2002/0121860 A1 | 9/2002 | Seo et al. | |
| 2002/0134984 A1 | 9/2002 | Igarashi | |
| 2002/0197393 A1 | 12/2002 | Kuwabara | |
| 2003/0048072 A1 | 3/2003 | Ishihara et al. | |
| 2003/0111666 A1 | 6/2003 | Nishi et al. | |
| 2003/0189401 A1 | 10/2003 | Kido et al. | |
| 2003/0214246 A1 | 11/2003 | Yamazaki | |
| 2004/0092195 A1 | 5/2004 | Marks et al. | |
| 2004/0135151 A1 | 7/2004 | Okamoto et al. | |
| 2004/0140758 A1 | 7/2004 | Raychaudhuri et al. | |
| 2004/0150352 A1 | 8/2004 | Koide et al. | |
| 2004/0161695 A1 | 8/2004 | Boroson et al. | |
| 2004/0187917 A1 | 9/2004 | Pichler | |
| 2004/0189167 A1 | 9/2004 | Adachi et al. | |
| 2004/0197601 A1 | 10/2004 | Thompson et al. | |
| 2004/0265253 A1* | 12/2004 | Seo ............... C03C 14/008 424/63 |
| 2005/0006667 A1 | 1/2005 | Yamazaki | |
| 2005/0035708 A1 | 2/2005 | Yamazaki et al. | |
| 2005/0084712 A1 | 4/2005 | Kido et al. | |
| 2005/0084713 A1 | 4/2005 | Kido et al. | |
| 2005/0098207 A1 | 5/2005 | Matsumoto et al. | |
| 2005/0106419 A1 | 5/2005 | Endoh et al. | |
| 2005/0123751 A1 | 6/2005 | Tsutsui et al. | |
| 2005/0158579 A1 | 7/2005 | Marks et al. | |
| 2005/0164589 A1* | 7/2005 | Ghosh ............ H01L 51/5253 445/24 |
| 2005/0170208 A1 | 8/2005 | Yatsunami et al. | |
| 2005/0248267 A1 | 11/2005 | Gyoutoku et al. | |
| 2006/0008740 A1 | 1/2006 | Kido et al. | |
| 2006/0072053 A1 | 4/2006 | Kathrigamanathan et al. | |
| 2007/0090376 A1 | 4/2007 | Kumaki et al. | |
| 2007/0114512 A1 | 5/2007 | Kumaki et al. | |
| 2007/0216292 A1 | 9/2007 | Seo et al. | |
| 2008/0135835 A1 | 6/2008 | Seo et al. | |
| 2008/0252199 A1 | 10/2008 | Yamazaki et al. | |
| 2009/0206746 A1 | 8/2009 | Seo et al. | |
| 2010/0096627 A1 | 4/2010 | Ikeda et al. | |
| 2010/0207518 A1 | 8/2010 | Ikeda et al. | |

FOREIGN PATENT DOCUMENTS

| | | |
|---|---|---|
| EP | 0 855 848 A2 | 7/1998 |
| EP | 0 948 063 A2 | 10/1999 |
| EP | 1 009 198 A1 | 6/2000 |
| EP | 1 065 723 A2 | 1/2001 |
| EP | 1 089 361 A2 | 4/2001 |
| EP | 1 093 167 A2 | 4/2001 |
| EP | 1 128 438 A1 | 8/2001 |
| EP | 1 160 891 A2 | 12/2001 |
| EP | 1 261 042 A1 | 11/2002 |
| EP | 1 351 558 A1 | 10/2003 |
| EP | 1 524 706 A2 | 4/2005 |
| EP | 1 524 707 A2 | 4/2005 |
| EP | 1 530 245 A2 | 5/2005 |
| JP | 57-36192 | 2/1982 |
| JP | 1-312873 A | 12/1989 |
| JP | 2-139892 A | 5/1990 |
| JP | 3-114197 A | 5/1991 |
| JP | 3-190088 A | 8/1991 |
| JP | 3-274695 A | 12/1991 |
| JP | 4-357694 A | 12/1992 |
| JP | 5-182766 A | 7/1993 |
| JP | 6-33050 | 2/1994 |
| JP | 6-166501 | 6/1994 |
| JP | 6-267658 A | 9/1994 |
| JP | 6-290873 A | 10/1994 |
| JP | 7-312289 A | 11/1995 |
| JP | 9-63771 A | 3/1997 |
| JP | 9-102628 | 4/1997 |
| JP | 9-279135 | 10/1997 |
| JP | 10-255985 A | 9/1998 |

(56) References Cited

FOREIGN PATENT DOCUMENTS

| | | |
|---|---|---|
| JP | 10-259095 | 9/1998 |
| JP | 10-270167 | 10/1998 |
| JP | 10-270171 A | 10/1998 |
| JP | 10-270172 | 10/1998 |
| JP | 10-308284 | 11/1998 |
| JP | 10-308284 A | 11/1998 |
| JP | 2824411 B | 11/1998 |
| JP | 11-31588 | 2/1999 |
| JP | 11-204260 | 7/1999 |
| JP | 11204260 A * | 7/1999 |
| JP | 11-251067 A | 9/1999 |
| JP | 11-263615 | 9/1999 |
| JP | 11-273861 | 10/1999 |
| JP | 11-297474 A | 10/1999 |
| JP | 11-307259 A | 11/1999 |
| JP | 11-307264 A | 11/1999 |
| JP | 2000-223276 A | 8/2000 |
| JP | 2000-306669 | 11/2000 |
| JP | 2000-315580 A | 11/2000 |
| JP | 2000-315581 | 11/2000 |
| JP | 2001-76868 A | 3/2001 |
| JP | 2001-185354 A | 7/2001 |
| JP | 2001-244079 A | 9/2001 |
| JP | 2002-15873 A | 1/2002 |
| JP | 2002-56985 | 2/2002 |
| JP | 2002-105057 | 4/2002 |
| JP | 2002-114917 | 4/2002 |
| JP | 2002-212422 | 7/2002 |
| JP | 2002-313580 | 10/2002 |
| JP | 2002-332567 A | 11/2002 |
| JP | 3343377 | 11/2002 |
| JP | 2002-367784 A | 12/2002 |
| JP | 2003-73387 | 3/2003 |
| JP | 2003-77661 | 3/2003 |
| JP | 2003-229278 A | 8/2003 |
| JP | 2003-272860 | 9/2003 |
| JP | 2004-506050 | 2/2004 |
| JP | 2004-134395 A | 4/2004 |
| JP | 2004-514257 | 5/2004 |
| JP | 2004-158216 | 6/2004 |
| JP | 2004-349007 A | 12/2004 |
| JP | 2005-8772 | 1/2005 |
| JP | 2005-26121 A | 1/2005 |
| JP | 2005-032618 A | 2/2005 |
| JP | 2005-123094 A | 5/2005 |
| JP | 2005-123095 A | 5/2005 |
| JP | 2005-166637 A | 6/2005 |
| JP | 2005-251587 A | 9/2005 |
| WO | WO 00/01203 A1 | 1/2000 |
| WO | WO 02/05971 A1 | 1/2002 |
| WO | WO 02/41414 A1 | 5/2002 |
| WO | WO 2004/085543 A1 | 10/2004 |
| WO | WO2005/006460 A1 | 1/2005 |
| WO | WO 2005/031798 A2 | 4/2005 |

OTHER PUBLICATIONS

Nakada, T. et al., "27a-ZL-12 Multi Photon Emission Organic EL Devices Using Charge-Transfer Complex as Charge Generation Layer," 63rd Applied Physics-Related Combined Seminar Seminar Proceedings, The Japan Society of Applied Physics, Sep. 24, 2002, p. 1165.

Tokito, S. et al., "Metal Oxides as a Hole-Injecting Layer for an Organic Electroluminescent Device," J. Phys. D: Appl. Phys. (Journal of Physics D: Applied Physics), vol. 29, 1996, pp. 2750-2753.

Adachi, C. et al., "Electroluminescence in Organic Films with Three-Layer Structure," Jpn. J. Appl. Phys. (Japanese Journal of Applied Physics), vol. 27, No. 2, Feb. 20, 1988, pp. L269-L271.

Sanchez, C. et al, "Chemical Modification of Alkoxide Precursors," Journal of Non-Crystalline Solids, vol. 100, 1988, pp. 65-76.

Sakka, S. Concise Statement: "Science of Sol-Gel Method," Agune Shouhuu, Tokyo, 1988, pp. 4-8.

Shinmou, K. et al, "Fine-Patterning of $ZrO_2$ Thin Films by the Photolysis of Chemically Modified Gel Films," Japanese Journal of Applied Physics, vol. 33, part 2, No. 8B, Aug. 15, 1994, pp. L1181-L1184.

Era, M. et al, "Organic-Inorganic Heterostructure Electroluminescent Device Using a Layered Perovskite Semiconductor $(C_6H_5C_2H_4NH_3)_2PbI_4$," Applied Physics Letters, vol. 65, No. 6, Aug. 8, 1994, pp. 676-678.

Wen, J. et al, "Organic/Inorganic Hybrid Network Materials by the Sol-Gel Approach," Chem Mater, vol. 8, No. 8, 1996, pp. 1667-1681.

Yamada, N. et al, "Synthesis and Dynamic Mechanical Behaviour of Inorganic-Organic Hybrids Containing Various Inorganic Components," J. Mater Chem., vol. 7, No. 8, 1997, pp. 1491-1495.

Dantas De Morris, T. et al, "Hybrid Organic-Inorganic Light-Emitting Diodes," Advanced Materials, vol. 11, No. 2, 1999, pp. 107-112.

"Section 4 Optical Material Relation: Manufacture and Application of Organic-Inorganic Composite Coating Thin Film," Organic-Inorganic Hybrid Material (Technical Data Collections) Jul. 30, 1999, pp. 208-215, (with English translation, pp. 1-11).

Schneider, M. et al, "Novel Electroluminescent Devices Based on Perylene-Doped Sol-Gel Layers," Advanced Materials, vol. 12, No. 5, 2000, pp. 351-354.

Nikolaou, S. et al, "Synthesis, Spectroscopy and Electrochemistry of a μ-oxo-triruthenium Cluster Containing a Bridged bis(2,2'-bipyridyl)ruthenium(II) Moiety," Polyhedron, vol. 20, 2001, pp. 253-259.

Sakka, S., Concise Statement: "Trend of Sol-Gel Method," Ceramics, vol. 37, No. 3, 2002, pp. 136-142.

Zhang, Q. et al, "Novel Hole-Transporting Materials Based on 1,4-bis(carbazolyl)benzene for Organic Light-Emitting Devices," Journal of Materials Chemistry, vol. 14, 2004, pp. 895-900.

International Search Report re application No. PCT/JP2004/003610, dated Jun. 22, 2004 (in Japanese).

Written Opinion re application No. PCT/JP2004/003610, dated Jun. 22, 2004 (with partial English translation).

U.S. Appl. No. 60/640,392 to Wang et al, dated Dec. 29, 2004.

U.S. Appl. No. 60/694,935 to Wang et al, dated Jun. 28, 2005.

International Search Report re application No. PCT/JP2005/019848, dated Jan. 17, 2006.

Written Opinion re application No. PCT/JP2005/019848, dated Jan. 17, 2006.

* cited by examiner

COMPOSITE MATERIAL, LIGHT-EMITTING ELEMENT, LIGHT-EMITTING DEVICE, AND MANUFACTURING METHOD THEREOF

This application is a divisional of copending U.S. application Ser. No. 11/666,196 Apr. 24, 2007 which is the US national stage of PCT/JP2005/019848 filed on Oct. 24, 2005 which are both incorporated herein by reference.

TECHNICAL FIELD

The present invention relates to an element (light-emitting element) that has a luminescent material including an organic material between electrodes and emits light by applying a current between the electrodes, and a light-emitting device manufactured by using the element. In particular, the present invention relates to a light-emitting element and a light-emitting device that are superior in heat-resistance and less deteriorates in luminance with emitting time.

BACKGROUND ART

In recent years, a light-emitting device and a display that use a light-emitting element formed by using an organic material have been actively developed. Since the light-emitting, which is manufactured by interposing an organic compound layer between a pair of electrodes, itself emits light unlike a liquid crystal display device, no light source such as a backlight is necessary, and the element itself is quite thin. Therefore, the light-emitting element is advantageous when a thin and lightweight display is manufactured.

The emission mechanism of the light-emitting element is said to be as follows: an electron injected from a cathode and a hole injected from an anode are recombined in the luminescence center in an organic compound to form a molecular exciton; and energy is released to emit light when the molecular exciton returns to the ground state. As the excited state, a singlet excited state and a triplet excited state are known, and it is believed that light can be emitted through either excited state.

The organic compound layer sandwiched between the electrodes often has a laminated structure, and a function-separation laminated structure of "a hole transporting layer, a light-emitting layer, and an electron transporting layer" is typical as this laminated structure. When a layer formed by using a highly hole transporting material and a layer formed by using a highly electron transporting material are disposed respectively on the side of an electrode that functions as an anode and on the side of an electrode that functions as a cathode to interpose a light-emitting layer in which a hole and an electron are recombined therebetween, holes and electrons can be transported efficiently, and further the recombination probability of holes and electrons can also be increased. This structure provides a quite high luminous efficiency, and is thus employed for most of light-emitting display devices currently under development (for example, Non-Patent Document 1).

[Non-Patent Reference 1]
Chihaya Adachi et al., Japanese Journal of Applied Physics, Vol. 27, No. 2, pp. L269-L271 (1988)

In addition, as other structures, there are a structure of stacking in the order of a hole injecting layer, a hole transporting layer, a light-emitting layer, and an electron transporting layer from an electrode that functions as an anode, and a structure of stacking in the order of a hole injecting layer, a hole transporting layer, a light-emitting layer, an electron transporting layer, and an electron injecting layer from an electrode that functions as an anode, and the respective layers are formed by using materials that specialize in the respective functions. It is to be noted a layer that has two or more of these functions, for example, a layer that has both functions of a light-emitting layer and an electron transporting layer, may be used.

The organic compound layer typically has a laminated structure as describes above. However, a layer formed to have a single layer structure or a mixed layer may be used, and a light-emitting layer may be doped with a fluorescent dye or the like.

However, this light-emitting element has problems with heat resistance and durability. Since this light-emitting is formed by stacking organic thin films using organic compounds as described above, fragility of the thin films using the organic compounds is considered to be a cause of the problems.

On the other hand, there is also an example of manufacturing a light-emitting element by applying not an organic thin film but a layer in which organic compounds (a hole transporting compound, an electron transporting compound, and a luminescent compound) are dispersed in a skeleton formed by a siloxane bond (for example, Patent Document 1 and Non-Patent Document 2). Further, in Patent Document 1, it is also reported that the durability and heat resistance of the element are improved.

[Patent Reference 1]
Japanese Patent Application Laid-Open No. 2000-306669
[Non-Patent Reference 2]
Tony Dantas de Morais et al., Advanced Materials, Vol. 11, No. 2, pp. 107-112 (1999)

However, in the light-emitting elements disclosed in Patent Document 1 and Non-Patent Document 2, current is hard to flow as compared with conventional light-emitting elements since the organic compounds are dispersed in the insulating skeleton formed by the siloxane bond.

In these light-emitting elements, since the luminance gets higher in proportion to an applied current, the fact that current is hard to flow means that the voltage for obtaining a predetermined luminance (driving voltage) also gets higher. Thus, the power consumption is increased.

In addition, in order to suppress short circuit of a light-emitting element due to dust and the like, it is effective to make the film thickness of the light-emitting element thicker. However, when the film thickness is made thicker in the light-emitting element that has the structure as shown in Patent Document 1 or Non-Patent Document 2, the increase in driving voltage is further exposed.

DISCLOSURE OF INVENTION

In view of the problems described above, it is an object of the present invention to provide a composite material (also referred to as a hybrid material) that can be used for manufacturing a heat-resistant light-emitting element, provide a composite material that can be used for manufacturing a durable light-emitting element that can be driven with stability for a long period of time, provide a composite material that can be used for manufacturing a light-emitting element that can satisfy the heat-resistance and the durability together, and further, provide a composite material that can be used for a manufacturing a light-emitting element having less increase in power consumption with the above objects.

In addition, it is an object of the present invention to provide a composite material that can be used for manufacturing a light-emitting element that easily prevents short circuit between electrodes and uses less power.

Further, it is an object or the present invention to provide a heat-resistant light-emitting element, provide a durable light-emitting element that can be driven with stability for a long period of time, provide a light-emitting element that can satisfy the heat-resistance and the durable together, and further, a light-emitting element having less increase in power consumption with the above objects.

In addition, it is an object of the present invention to provide a light-emitting element that easily prevents short circuit between electrodes and uses less power.

A composite material according to the present invention, which is able to achieve the objects described above, includes a first metal oxide skeleton comprising a first metal atom and an organic compound that is bound to the first metal atom by forming a chelate, where the first metal oxide exhibits an electron accepting property to the organic compound.

The above-described composite material has a feature that the organic compound is an organic compound having an arylamine skeleton.

In addition, the above-described composite material has a feature that the first metal atom is a transition metal, specifically, one or more of titanium, vanadium, molybdenum, tungsten, rhenium, ruthenium, and niobium.

Further, another composite material according to the present invention includes a first metal oxide skeleton comprising a first metal atom and an organic compound that is bound to the first metal atom by forming a chelate, where the metal oxide exhibits an electron donating property to the organic compound.

The above-described composite material has a feature that the organic compound is an organic compound having one or more of a pyridine skeleton, a pyrazine skeleton, a triazine skeleton, an imidazole skeleton, a triazole skeleton, an oxadiazole skeleton, a thiadiazole skeleton, an oxazole skeleton, and a thiazole skeleton.

In addition, the above-described composite material has a feature that the first metal atom is an alkali metal or an alkali-earth metal, specifically, any one or more of lithium, calcium, and barium.

In addition, the above-described composite material may further include a second metal oxide, for example, may include aluminum oxide.

The composite materials according to the present invention, which are described above, may further include a third metal oxide. As the third metal oxide, silicon oxide is preferable.

Further, another composite material according to the present invention includes a first metal oxide skeleton comprising a first metal atom, an organic compound that is bound to the first metal atom by forming a chelate, and a second metal oxide comprising a second metal atom, where the second metal oxide exhibits an electron accepting property to the organic compound.

The above-described composite material has a feature that the valence of the first metal atom is trivalent or more and hexavalent or less, and has a feature that the first metal atom is a metal atom belonging to Group 13 or 14, and specifically, is preferably any one of aluminum, gallium, and indium.

In addition, the above-described composite material has a feature that the organic compound is an organic compound having an arylamine skeleton.

In addition, the above-described composite material has a feature that the second metal atom is a transition metal, specifically, any one of titanium, vanadium, molybdenum, tungsten, rhenium, ruthenium, and niobium.

Further, another composite material according to the present invention includes a first metal oxide skeleton comprising a first metal atom, an organic compound that is bound to the first metal atom by forming a chelate, and a second metal oxide comprising a second metal atom, where the second metal oxide exhibits an electron donating property to the organic compound.

The above-described composite material has a feature that the valence of the first metal atom is trivalent or more and hexavalent or less, and has a feature that the first metal atom is a metal atom belonging to Group 13 or 14, and specifically, is preferably any one or more of aluminum, gallium, and indium.

In addition, the above-described composite material has a feature that the organic compound is an organic compound having one or more of a pyridine skeleton, a pyrazine skeleton, a triazine skeleton, an imidazole skeleton, a triazole skeleton, an oxadiazole skeleton, a thiadiazole skeleton, an oxazole skeleton, and a thiazole skeleton.

In addition, the above-described composite material has a feature that the second Metal atom is an alkali metal or an alkali-earth metal, specifically, any one of lithium, calcium, and barium.

The composite materials according to the present invention, which are described above, may further include a third metal oxide. As the third metal oxide, silicon oxide is preferable.

Moreover, the composite materials according to the present invention can be used for light-emitting elements. Accordingly, a light-emitting element according to the present invention includes a light-emitting layer including a luminescent material and a layer including the composite material described above between a pair of electrodes.

In the above-described light-emitting element, it is preferable that the layer including the composite material be provided in contact with one or both of the pair of electrodes.

Furthermore, the present invention also includes a light-emitting device including the light-emitting element described above.

A light-emitting element using the above-described composite material according to the present invention serves as a heat-resistant light-emitting element. Further, a light-emitting element using the above-described composite material according to the present invention serves as a light-emitting element that can be driven with stability for a long period of time. Further, a light-emitting element using the above-described composite material according to the present invention serves as a heat-resistant light-emitting element that can be driven with stability for a long period of time. Further, a light-emitting element using the above-described composite material according to the present invention serves as a light-emitting element having less increase in power consumption in addition to the above effects.

The above-described light-emitting element according to the present invention can serve as a heat-resistant light-emitting element. Further, the above-described light-emitting element according to the present invention can serve as a light-emitting element that can be driven with stability for a long period of time. Further, the above-described light-emitting element can serve as a heat-resistant light-emitting element that can be driven with stability for a long period of time. Further, the above-described light-emitting element can serve as a light-emitting element having less increase in power consumption in addition to the above effects.

Further, a light-emitting element that easily prevents short circuit between electrodes and uses less power can be provided.

BRIEF DESCRIPTION OF DRAWINGS

In the accompanying drawings:

FIGS. 20A and 20B are diagrams illustrating the structures of light-emitting elements according to the present invention; and.

BEST MODE FOR CARRYING OUT THE INVENTION

Embodiment Modes of the present invention will be described below with reference to the accompanying drawings. However, the present invention may be embodied in a lot of different forms, and it is to be easily understood that various changes and modifications will be apparent to those skilled in the art unless such changes and modifications depart from the scope of the present invention. Therefore, the present invention is not to be construed with limitation to what is described in the embodiments.

It is to be noted that, of a pair of electrodes of a light-emitting element in the present invention, an electrode to which a voltage is applied to have a higher potential so that luminescence can be obtained is referred to as an electrode that functions as an anode, and an electrode to which a voltage is applied to have a lower potential so that luminescence can be obtained is referred to as an electrode that functions as a cathode.

Further, in the present invention, unless otherwise noted, a hole injecting layer indicates a layer that is formed by using a substance in which the barrier against injecting holes from an electrode is lower than the barrier against injecting electrons and is located more on the side of an electrode that functions as an anode than a light-emitting layer, and a hole transporting layer indicates a layer that is formed by using a substance that has a higher hole transporting property rather than an electron transporting property and is located more on the side of an electrode that functions as an anode than a light-emitting layer. In addition, a layer that has both of these functions may be used. Further, an electron injecting layer indicates a layer that is formed by using a substance in which the barrier against injecting electrons from an electrode is lower than the barrier against injecting holes and is located more on the side of an electrode that functions as a cathode than a light-emitting layer, and an electron transporting layer indicates a layer that is formed by using a substance that has a higher electron transporting property rather than a hole transporting property and is located more on the side of an electrode that functions as a cathode than a light-emitting layer. In addition, a layer that has both of these functions may be used.

Embodiment Mode 1

Figure 1:
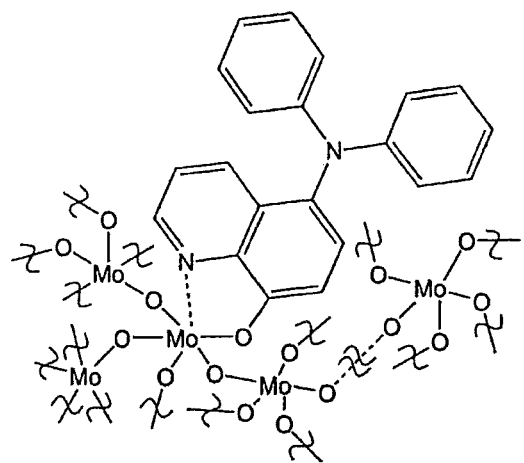
FIG. 1 is a schematic diagram of a composite material according to the present invention.
Figure 2:
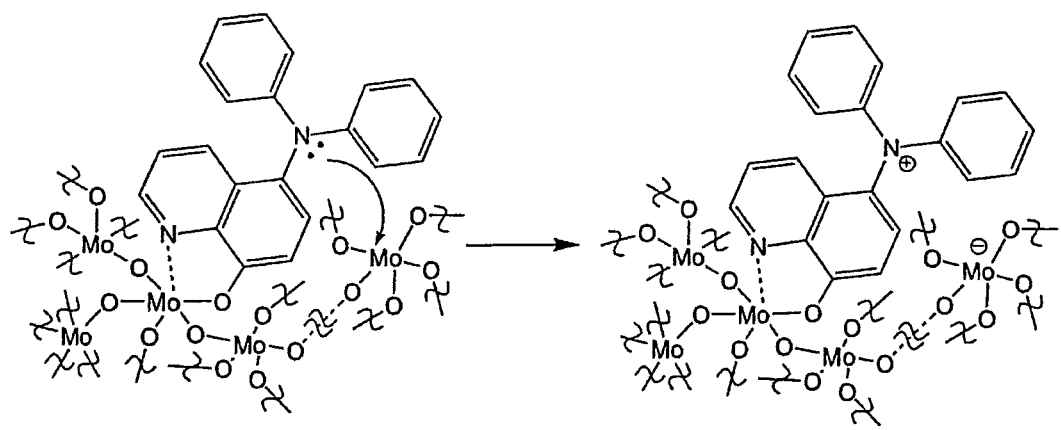
FIG. 2 is a schematic diagram showing electrons donated and accepted in the composite material according to the present invention.

FIG. 1 shows a schematic diagram of a composite material according to the present invention in the present embodiment. In the composite material according to the present invention in the present embodiment, a hole injecting and/or transporting organic compound as a chelate ligand is bound to part or all of metals in a first metal oxide skeleton forming a binding network, and further, the metal oxide is able to accept electrons from the organic compound. In this composite material, a hole is generated by donating and accepting an electron as shown in a schematic diagram of FIG. 2, and the hole injecting property and conductivity of the composite material is thus improved. FIG. 2 shows a matrix of molybdenum oxide with 5-diphenylamino-8-quinolinol as ligand, and is a schematic diagram illustrating molybdenum oxide accepting an electron from 5-diphenylamino-8-quinolinol.

This composite material has the metal oxide skeleton, and is thus a heat-resistant and durable material. In addition, since the hole injecting and/or transporting organic compound as a chelate ligand is bound to the metal in the skeleton, the composite material is able to possess the hole injecting or transporting property of the organic compound. Further, since the metal oxide forming the skeleton is able to accept electrons from the organic compound, the hole injecting or transporting property and conductivity of the composite material can be improved.

This composite material can be used as a material for a hole injecting layer or a hole transporting layer in a light-emitting element to provide a heat-resistant light-emitting element, a light-emitting element that can be driven with stability for a long period of time, a heat-resistant light-emitting element that can be driven with stability for a long period of time, and a light-emitting element having less increase in power consumption in addition to the above effects.

It is to be noted that the increase in driving voltage is less even when a light emitting element using the composite material in the present embodiment for a hole injecting layer or a hole transporting layer is formed so that the hole injecting or transporting layer has a thick film thickness. Therefore, the film thickness of a layer between one of a pair of electrodes of a light-emitting element, which is formed first, and a light-emitting layer of the light-emitting element can be made thick so that short circuit of the light-emitting element due to dust and the like can be reduced. When the film thickness is 100 nm or more, this defect can be reduced effectively. Further, the composite material according to the present invention is improved in the conductivity and the carrier injecting or transporting property, and thus, short circuit of the light-emitting element due to dust and the like can be reduced without increasing the driving voltage significantly, that is, without increasing the power consumption significantly.

In addition, it is preferable to use an organic compound having an arylamine skeleton as the organic compound that is bound as a chelate ligand in the first metal oxide skeleton and provides a hole injecting property and/or a hole transporting property. Examples of the compound having the arylamine skeleton include compounds represented by the following structure formulas (1) to (4). Of course, any other compounds other than these compounds may be used as long as the compounds can be bound as a chelate ligand in the first metal oxide skeleton and provide a hole injecting property and/or a hole transporting property. It is to be noted that only one of these organic compounds may be used, or two or more thereof may be used. In the case of using two or more of the organic compounds, a composite material in which the two or more organic compounds as chelate ligands are bound to part or all of metals in the first metal oxide skeleton can be obtained.

Structure Formulas (1) to (4)

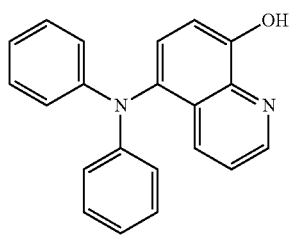

(1)

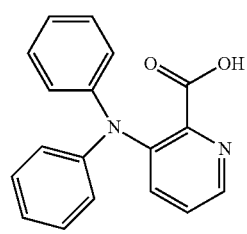

(2)

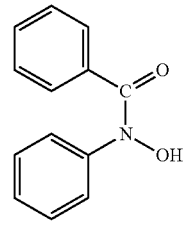

(3)

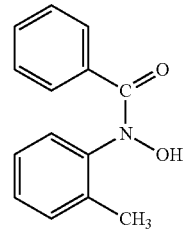

(4)

In addition, it is preferable to use a transition metal as the metal species for the metal oxide that forms the metal oxide skeleton and is able to accept electrons from the organic compound that is bound as a chelate ligand, and it is more preferable to use any one or more of titanium, vanadium, molybdenum, tungsten, rhenium, ruthenium, and niobium. The metal oxide skeleton can be formed by using one or more of transition metals.

Figure 9:
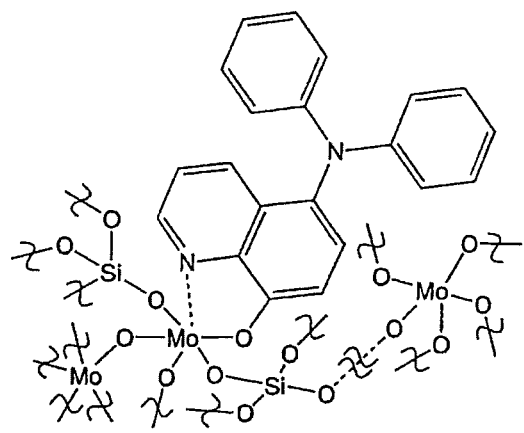
FIG. 9 is a schematic diagram of a composite material according to the present invention.

In addition, another metal oxide may further be added to the composite material in the present embodiment. The metal oxide that exhibits an electron accepting property to the organic compound included in the composite material in the present embodiment and the added metal oxide may form a composite oxide or may individually form independent metal oxide skeletons. As the added metal oxide, an oxide of a metal belonging to Group 13 or 14 of the periodic table, which has a large valence, is preferable. In particular, silicon oxide is preferable. FIG. 9 shows an example in which the metal oxide (molybdenum oxide) that exhibits an electron accepting property to the organic compound and the added metal oxide (silicon oxide) form a composite oxide. The binding network of the metal oxide is more easily formed by adding another metal oxide that has a large valence. It is to be noted that the elements belonging to Group 14 are considered as metals except for carbon in the specification.

Further, it is preferable that in the composite material in the present embodiment, the amount of the organic compound described above, which has a hole injecting or transporting property, be 0.1 mol or more and 1 mol or less with respect to 1 mol of the metal atoms of the metal oxide that exhibits an electron accepting property to the organic compound.

Embodiment Mode 2

Figure 3:
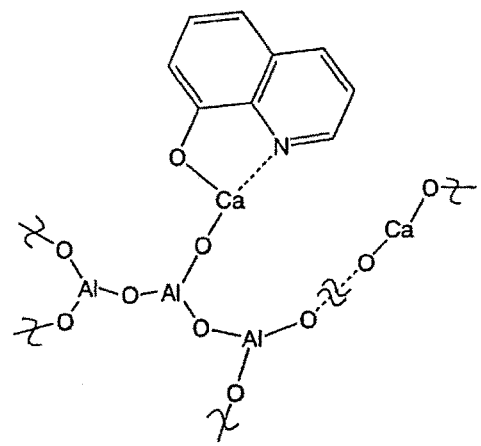
FIG. 3 is a schematic diagram of a composite material according to the present invention.
Figure 4:
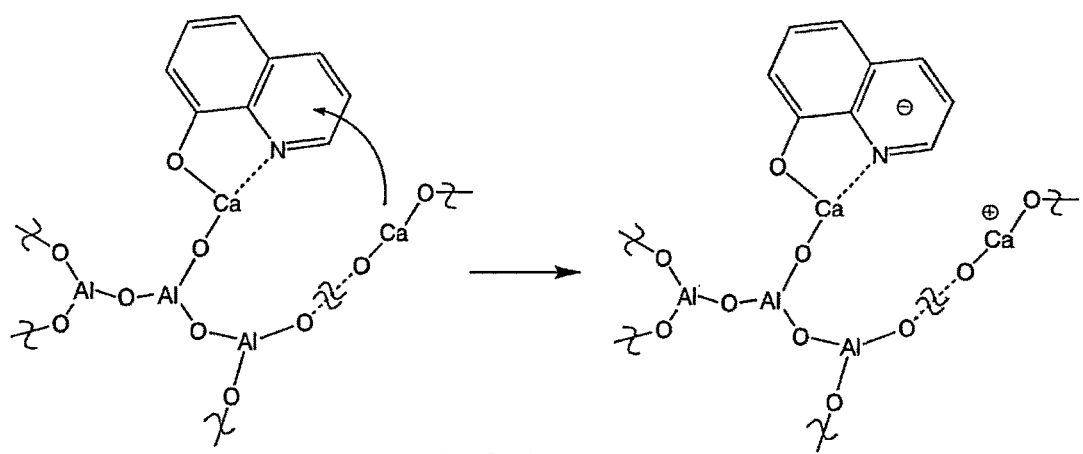
FIG. 4 is a schematic diagram showing electrons donated and accepted, in the composite material according to the present invention.

FIG. 3 shows a schematic diagram of a composite material according to the present invention in the present embodiment. In the composite material according to the present invention in the present embodiment, an electron injecting or transporting organic compound as a chelate ligand is bound to part or all of metals in a first metal oxide skeleton forming a binding network, and further, the metal oxide is able to donate electrons to the organic compound. In this composite material, an electron is generated by donating and accepting the electron as shown in a schematic diagram of FIG. 4, and the electron injecting property and conductivity of the composite material is thus improved. FIG. 4 shows a matrix including calcium oxide with 8-quinolinol as a ligand, and is a schematic diagram illustrating calcium oxide donating an electron to 8-quinolinol.

This composite material has the metal oxide skeleton, and is thus a heat-resistant and durable material. In addition, since the electron injecting or transporting organic compound as a chelate ligand is bound to the metal in the skeleton, the composite material is able to possess the electron injecting or transporting property of the organic compound. Further, since the organic compound is composed of a material that is able to be given electrons from the metal oxide skeleton, the electron injecting or transporting property and conductivity of the composite material can be improved.

This composite material can be used as a material for an electron injecting layer or an electron transporting layer in a light-emitting element to provide a heat-resistant light-emitting element, a light-emitting element that can be driven with stability for a long period of time, a heat-resistant light-emitting element that Can be driven with stability for a long period of time, and a light-emitting element having less increase in power consumption with the above effects.

It is to be noted that the increase in driving voltage is less even when a light emitting element using the composite material in the present embodiment for an electron injecting layer or an electron transporting layer is formed so that the electron injecting or transporting layer has a thick film thickness. Therefore, the film thickness of a layer between one of a pair of electrodes of a light-emitting element, which is formed first, and a light-emitting layer of the light-emitting element can be made thick so that short circuit of the light-emitting element due to dust and the like can be reduced. When the film thickness is 100 nm or more, this defect can be reduced effectively. Further, the composite material according to the present invention is improved in the conductivity and the carrier injecting or transporting property, and thus, short circuit of the light-emitting element due to dust and the like can be reduced without increasing the driving voltage significantly, that is, without increasing the power consumption significantly.

In addition, it is preferable to use an organic compound having at least one of a pyridine skeleton, a pyrazine skeleton, a triazine skeleton, an imidazole skeleton, a triazole skeleton, an oxadiazole skeleton, a thiadiazole skeleton, an oxazole skeleton, and a thiazole skeleton as the organic compound that is bound as a chelate ligand in the first metal oxide skeleton and provides an electron injecting property and/or an electron transporting property. Examples thereof include the following structure formulas (5) to (13) as an organic compound having a pyridine skeleton, the following structure formulas (14) to (16) as an organic compound having a pyrizine skeleton, the following structure formulas (17) and (18) as an organic compound having an imidazole skeleton, the following structure formula (19) as an organic compound having an oxadiazole skeleton, the following structure formula (20) as an organic compound having a thiadiazole skeleton, the following structure formula (21) as an organic compound having an oxazole skeleton, and the following structure formula (22) as an organic compound as a thiazole skeleton. Of course, any other compounds other than these compounds may be used as long as the compounds can be bound as a chelate ligand in the first metal oxide skeleton and provide an electron injecting property and/or an electron transporting property. It is to be noted that only one of these organic compounds may be used, or two or more thereof may be used. In the case of using two or more of the organic compounds, a composite material in which the organic compounds as chelate ligands are bound to part or all of metals in the first metal oxide skeleton can be obtained.

Structure Formulas (5) to (13)

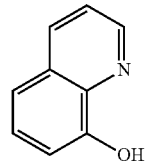
(5)

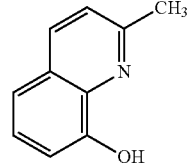
(6)

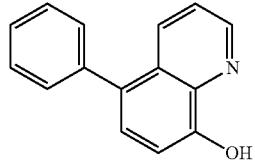
(7)

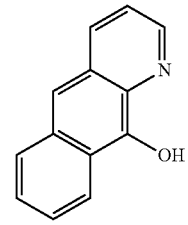
(8)

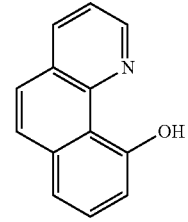
(9)

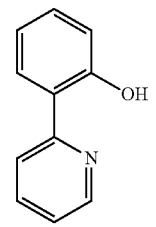
(10)

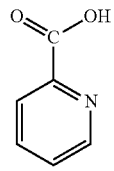
(11)

-continued
(12)
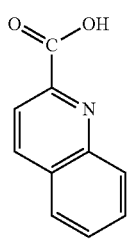
(13)
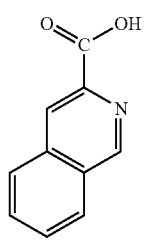
Structure Formulas (14) to (16)
(14)
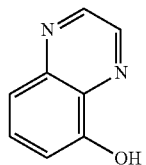
(15)
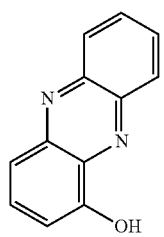
(16)
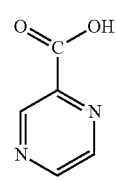
Structure Formulas (17) and (18)
(17)
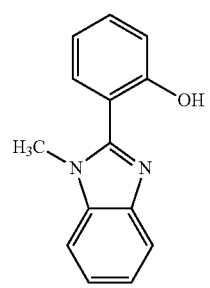
-continued
(18)
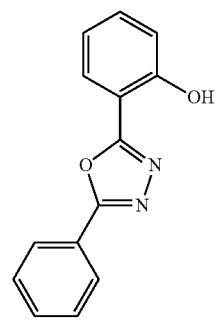
Structure Formula (19)
(19)
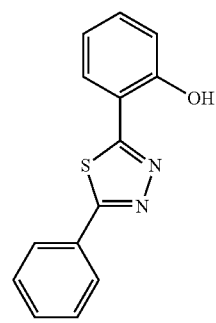
Structure Formula (20)
(20)
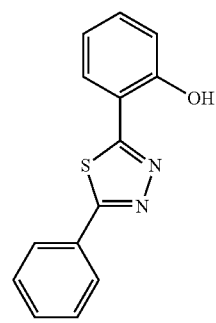
Structure Formula (21)
(21)
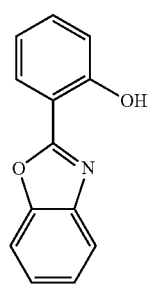

Structure Formula (22)

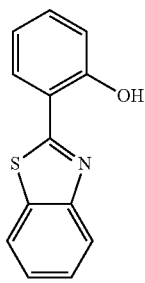

(22)

In addition, it is preferable to use one or more of alkali metals and alkali-earth metals for the metal oxide that forms the metal oxide skeleton and is able to donate electrons to the organic compound that is bound as a chelate ligand, and it is more preferable to use any one or more of lithium, calcium, and barium. It is to be noted that two or more kinds of metals are used to form an oxide skeleton in the case of using a metal that is not able to form an oxide skeleton by itself. Namely, a second metal oxide may be further added to form an oxide skeleton. For example, as shown in FIG. 3, a composite oxide skeleton of aluminum oxide and calcium oxide may be provided as the metal oxide skeleton by including aluminum oxide as the second metal oxide.

In addition, a third metal oxide may further be added to the composite material in the present embodiment. The metal oxide that exhibits an electron donating property to the organic compound included in the composite material in the present embodiment and the added third metal oxide may form a composite oxide or may individually form independent metal oxide skeletons. As the added third metal oxide, an oxide of a metal belonging to Group 13 or 14 of the periodic table, which has a large valence, is preferable. In particular, silicon oxide is preferable. The binding network of the metal oxide is more easily formed by adding another metal oxide that has a large valence.

Further, it is preferable that in the composite material in the present embodiment, the amount of the organic compound described above, which has an electron injecting or transporting property, be 0.1 mol or more and 1 mol or less with respect to 1 mol of the metal atoms of the first metal oxide.

Embodiment Mode 3

Figure 5:
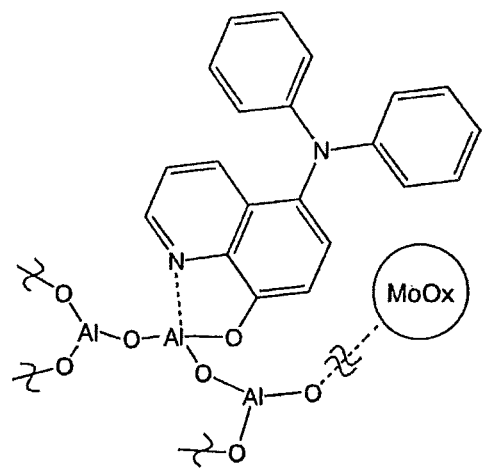
FIG. 5 is a schematic diagram of a composite material according to the present invention.
Figure 6:
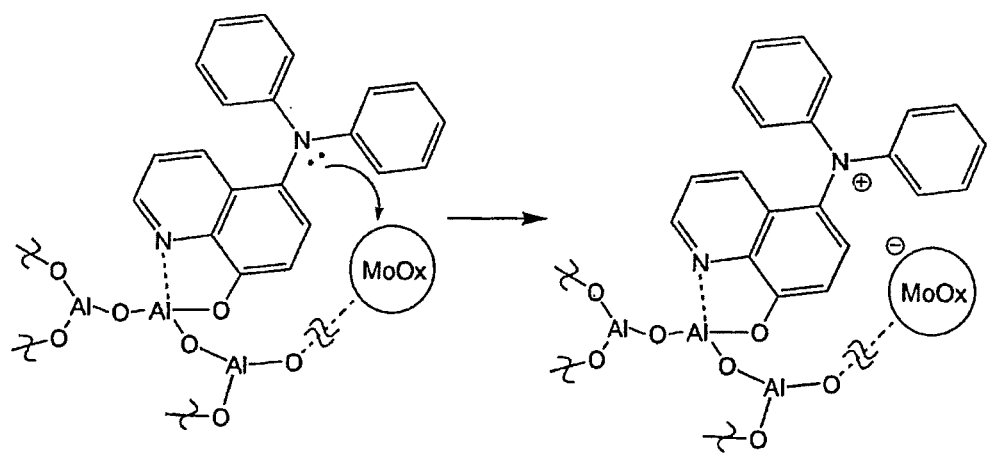
FIG. 6 is a schematic diagram showing electrons donated and accepted in the composite material according to the present invention.

FIG. 5 shows a schematic diagram of a composite material according to the present invention in the present embodiment. In the composite material according to the present invention in the present embodiment, a hole injecting or transporting organic compound as a chelate ligand is bound to part or all of metals in a first metal oxide skeleton forming a binding network, and a second metal oxide that is able to accept electrons from the organic compound is further added. In this composite material, a hole is generated by donating and accepting an electron as shown in a schematic diagram of FIG. 6, and the hole injecting property and conductivity of the composite material is thus improved. FIG. 6 is a schematic diagram illustrating molybdenum oxide accepting an electron from 5-diphenylamino-8-quinolinol in the composite material including a matrix of aluminum oxide with 5-diphenylamino-8-quinolinol as a ligand and further including molybdenum oxide.

This composite material has the metal oxide skeleton, and is thus a heat-resistant and durable material. In addition, since the hole injecting or transporting organic compound as a chelate ligand is bound to the metal in the skeleton, the composite material is able to possess the hole injecting or transporting property of the organic compound. Further, since an electron is donated and accepted between the organic compound and the second metal oxide that is able to accept electrons from the organic compound, the hole injecting or transporting property and conductivity of the composite material can be improved.

This composite material can be used as a material for a hole injecting layer or a hole transporting layer in a light-emitting element to provide a heat-resistant light-emitting element, a light-emitting element that can be driven with stability for a long period of time, a heat-resistant light-emitting element that can be driven with stability for a long period of time, and a light-emitting element having less increase in power consumption in addition to the above effects.

It is to be noted that the increase in driving voltage is less even when a light emitting element using the composite material in the present embodiment for a hole injecting layer or a hole transporting layer is formed so that the hole injecting or transporting layer has a thick film thickness. Therefore, the film thickness of a layer between one of a pair of electrodes of a light-emitting element, which is formed first, and a light-emitting layer of the light-emitting element can be made thick so that short circuit of the light-emitting element due to dust and the like can be reduced. When the film thickness is 100 nm or more, this defect can be reduced effectively. Further, the composite material according to the present invention is improved in the conductivity and the carrier injecting or transporting property, and thus, short circuit of the light-emitting element due to dust and the like can be reduced without increasing the driving voltage significantly, that is, without increasing the power consumption significantly.

As the organic compound that is bound as a chelate ligand in the first metal oxide skeleton and provides a hole injecting property and/or a hole transporting property, the same material as the organic compound that provides a hole injecting property and/or a hole transporting property to the composite material in the structure shown in FIG. 1 may be preferably used. Specifically, it is preferable to use an organic compound having an arylamine skeleton, and for example, the organic compounds represented by the structure formulas (1) to (4) mentioned above may be used.

In addition, it is preferable to use a transition metal oxide as the second metal oxide that is able to accept electrons from the organic compound that is bound as a chelate ligand, and it is more preferable that the second metal oxide be an oxide of any one or more of titanium, vanadium, molybdenum, tungsten, rhenium, ruthenium, and niobium for the second metal oxide.

In addition, the first metal atom forming the first metal oxide skeleton is not limited. However, in order to form the binding network, it is preferable that the first metal atom be a metal atom that has a large valence, and specifically, it is preferable that the valence of the first metal be trivalent or more and hexavalent or less. Further, a metal belonging to Group 13 or 14 is preferable, and particularly, aluminum, gallium, or indium is preferable. The oxide skeleton may include one kind of metal, or two or more kinds of metals may be included.

Figure 10:
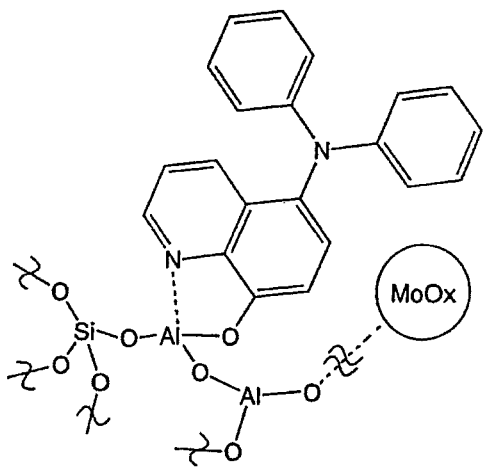
FIG. 10 is a schematic diagram of a composite material according to the present invention.

In addition, a third metal oxide may further be added to the composite material in the present embodiment. It is to be noted that the first and second metal oxides described above ant the added third metal oxide may form a composite oxide or may individually form independent metal oxide skeletons. As the added third metal oxide, an oxide of a metal belonging to Group 13 or 14 of the periodic table, which has a large valence, is preferable. In particular, silicon oxide is preferable. FIG. 10 shows an example in which the second metal oxide (molybdenum oxide) that exhibits an electron accepting property to the organic compound is included, and the first metal oxide (aluminum oxide) having the first metal atom (aluminum) to which the organic compound is bound as a chelate ligand and the third metal oxide (silicon oxide) form a composite oxide. The binding network of the metal oxide is more easily formed by adding the third metal oxide, which has a large valence.

Further, it is preferable that in the composite material in the present embodiment, the amount of the first organic compound described above, which has a hole injecting or transporting property, be 0.1 mol or more and 1 mol or less with respect to 1 mol of the metal atoms of the first metal oxide, and be 0.1 mol or more and 10 mol or less with respect to 1 mol of the metal atoms of the second metal oxide.

Embodiment Mode 4

Figure 7:
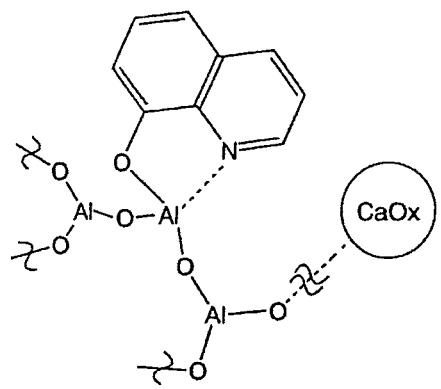
FIG. 7 is a schematic diagram of a composite material according to the present invention.
Figure 8:
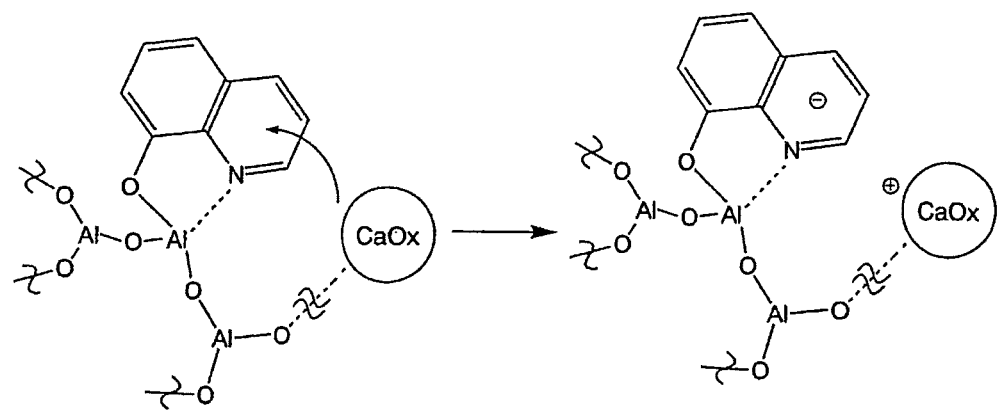
FIG. 8 is a schematic diagram showing electrons donated and accepted in the composite material according to the present invention.

FIG. 7 shows a schematic diagram of a composite material according to the present invention in the present embodiment. In the composite material according to the present invention in the present embodiment, an electron injecting or transporting organic compound as a chelate ligand is bound to part or all of metals in a first metal oxide skeleton forming a binding network, and a second metal oxide that is able to donate electrons to the organic compound is further added. In this composite material, an electron is generated by donating and accepting the electron as shown in a schematic diagram of FIG. 8, and the electron injecting property and conductivity of the composite material is thus improved. FIG. 8 is a schematic diagram illustrating calcium oxide donating an electron to 8-quinolinol in the composite material including a matrix of aluminum oxide with 8-quinolinol as a ligand and further including molybdenum oxide.

This composite material has the metal oxide skeleton, and is thus a heat-resistant and durable material. In addition, since the electron injecting or transporting organic compound as a chelate ligand is bound to the metal in the skeleton, the composite material is able to possess the electron injecting or transporting property of the organic compound. Further, since an electron is donated and accepted between the organic compound and the second metal oxide that is able to donate electrons to the organic compound, the electron injecting or transporting property and conductivity of the composite material can be improved.

This composite material can be used as a material for an electron injecting layer or an electron transporting layer in a light-emitting element to provide a heat-resistant light-emitting element, a light-emitting element that can be driven with stability for a long period of time, a heat-resistant light-emitting element that can be driven with stability for a long period of time, and a light-emitting element having less increase in power consumption in addition to the above effects.

It is to be noted that the increase in driving voltage is less even when a light emitting element using the composite material in the present embodiment for an electron injecting layer or an electron transporting layer is formed so that the electron injecting or transporting layer has a thick film thickness. Therefore, the film thickness of a layer between one of a pair of electrodes of a light-emitting element, which is formed first, and a light-emitting layer of the light-emitting element can be made thick so that short circuit of the light-emitting element due to dust and the like can be reduced. When the film thickness is 100 nm or more, this defect can be reduced effectively. Further, the composite material according to the present invention is improved in the conductivity and the carrier injecting or transporting property, and thus, short circuit of the light-emitting element due to dust and the like can be reduced without increasing the driving voltage significantly, that is, without increasing the power consumption significantly.

As the organic compound that is bound as a chelate ligand in the first metal oxide skeleton and provides an electron injecting property and/or an electron transporting property, the same material as the organic compound that provides an electron injecting property and/or an electron transporting property to the composite material in the structure shown in FIG. 3 may be preferably used. Specifically, it is preferable to use an organic compound having at least one of a pyridine skeleton, a pyrazine skeleton, a triazine skeleton, an imidazole skeleton, a triazole skeleton, an oxadiazole skeleton, a thiadiazole skeleton, an oxazole skeleton, and a thiazole skeleton, and for example, the organic compounds represented by the structure formulas (5) to (22) mentioned above may be used.

In addition, it is preferable to use an oxide of one or more of alkali metals and alkali-earth metals as the second metal oxide that is able to donate electrons to the organic compound that is bound as a chelate ligand, and it is more preferable to use an oxide of any one or more of lithium, calcium, and barium.

In addition, the first metal forming the first metal oxide skeleton is not limited. However, a metal belonging to Group 13 or 14 is preferable, and particularly, aluminum, gallium, or indium is preferable. The oxide skeleton may include one kind of metal, or two or more kinds of metals may be included.

In addition, a third metal oxide may further be added to the composite material in the present embodiment. It is to be noted that the first and second metal oxides described above ant the added third metal oxide may form a composite oxide or may individually form independent metal oxide skeletons. As the added third metal oxide, an oxide of a metal belonging to Group 13 or 14 of the periodic table, which has a large valence, is preferable. In particular, silicon oxide is preferable. The binding network of the metal oxide is more easily formed by adding the third metal oxide, which has a large valence.

Further, it is preferable that, in the composite material in the present embodiment, the amount of the first organic compound described above, which has an electron injecting or transporting property, be 0.1 mol or more and 1 mol or less with respect to 1 mol of the metal atoms of the first metal oxide, and be 0.1 mol or more and 10 mol or less with respect to 1 mol of the metal atoms of the second metal oxide.

It is to be noted that the metal oxide may include a hydroxyl group in a portion thereof in each of the composite materials according to the present invention as described above in Embodiment Modes 1 to 4.

Embodiment Mode 5

In the present embodiment, a method of manufacturing the composite material according to the present invention, which is described in Embodiment Mode 1 or 2, by a sol-gel method using a metal alkoxide will be described.

The following formulas (23) and (24) show a scheme of the method. In the present embodiment, a case of manufacturing the composite material (Embodiment Mode 1) using a molybdenum oxide skeleton as the first metal oxide skeleton and 5-diphenylamino-8-quinolinol as the organic compound that has a hole injecting or transporting property and is able to be bound to a molybdenum atom as a chelate ligand, from which the molybdenum oxide is able to accept electrons, will be described as an example. The same basic principle is applied also to a case of using another metal oxide skeleton, a case of using a metal oxide skeleton having two or more kinds of metals, and a case of using another organic compound.

Formula (23)

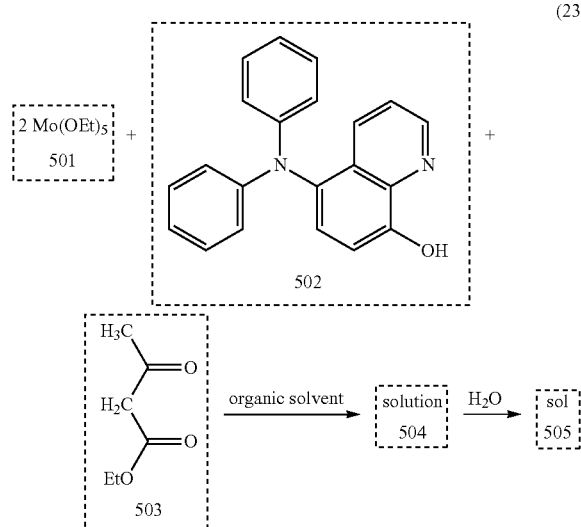

Formula (24)

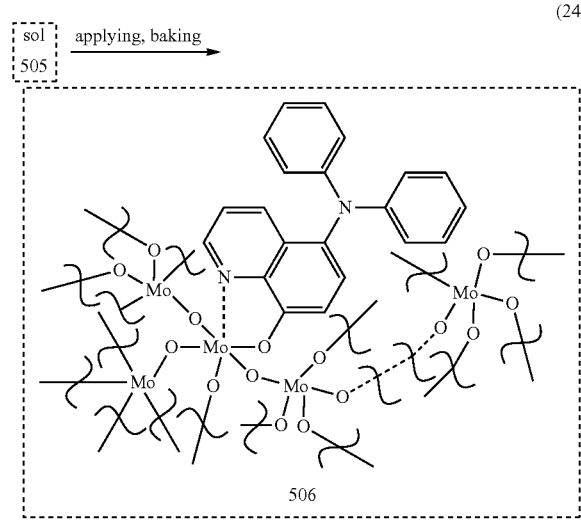

The formula (23) shows a pathway of dissolving and reacting a metal alkoxide 501 (here, pentaethoxy molybdenum (V)) including metal atoms of the first metal oxide, an organic compound 502 (here, 5-diphenylamino-8-quinolinol) that gives a hole injecting or transporting property to the composite material according to the present invention, and a stabilization agent 503 (here, ethyl acetoacetate) at a ratio of 2:1:1 [unit:mol] in an appropriate organic solvent to prepare a solution 504, and carrying out hydrolysis by adding water to obtain a sol 505. In this case, as the organic solvent, for example, tetrahydrofuran (THF), acetonitrile, dichloromethane, dichloroethane, and a mixed solvent of these can be used in addition to lower alcohols such as methanol, ethanol, n-propanol, i-propanol, n-butanol, and sec-butanol. However, the organic solvent is not limited to these.

In addition, it is preferable that the amount of the organic compound 502 be 0.1 mol or more and 1 mol or less with respect to 1 mol of the metal alkoxide 501.

It is to be noted that the stabilization agent 503 is added for preventing precipitation from being produced due to rapid progress of polycondensation when water is added. However, the stabilization agent 503 is not indispensable since the organic compound 502 can act also as a stabilization agent. When the organic compound 502 is small in amount (specifically, 0.5 mol or less with respect to 1 mol of the metal alkoxide 501), however, it is preferable to add the stabilization agent 503 since the stabilization ability is impaired. As the stabilization agent 503, weak chelating agents such as β-diketones, diamines, and aminoalcohols are preferable, and specifically, acetylacetone, benzoylacetone, ethylenediamine, monoethanolamine, and the like can be cited in addition to ethyl acetoacetate shown in the formula (23). However, the stabilization agent 503 is not limited to these. The stabilization agent 503 can exert an effect when the amount of the stabilization agent 503 is 0.5 mol or more with respect to 1 mol of the metal alkoxide 501. In addition, it is preferable that the addition amount of the stabilization agent 503 be 6 mol or less with respect to 1 mol of the metal alkoxide 501 since the metal of the metal alkoxide 501 is hexavalent or less.

It is preferable that the addition amount of the water that is used for the hydrolysis be 2 mol or more and 6 mol ore less with respect to 1 mol of the metal alkoxide 501 since the metal of the metal alkoxide 501 is a divalent to hexavalent metal. However, hydrolysis is not indispensable.

When a composite material to which a second metal oxide and a third metal oxide are further added is manufactured as the composite material, a second metal alkoxide including the metal of the second metal oxide and a third metal alkoxide including the metal of the third metal oxide may be added to the solution 504. In this case, the stabilization agent mentioned above may be further added appropriately. In addition, when silicon oxide is applied as the third metal oxide, tetraalkoxysilane may be used as the third metal alkoxide, and in this case, it is preferable that the solution 504 be made acid or alkaline, more preferably, acid at pH 1 to 3.

The formula (24) shows a process of applying and baking the thus obtained sol 505 to obtain a composite material 506 according to the present invention. For the process, a method of applying the sol 505 on a base material by wet coating and baking the sol 505 at a temperature of 100° C. or more but not exceeding 300° C. under atmospheric pressure or reduced pressure can be used. The baking may be performed either in the atmosphere or in an inert gas (for example, nitrogen or argon). In addition, when a stabilization agent is used in the formula (23), it is preferable to remove the stabilization agent by this baking.

Further, as shown in the formula (23), when a β-diketone (ethyl acetoacetate in the formula (23)) is added as a stabilization agent, gelation may be conducted in such a way that the sol 505 is applied on a base material by wet coating, and then, irradiated with ultraviolet light of a wavelength overlapping with an ultraviolet absorption spectrum of a state in which the β-diketone is bound to the metal atom as a ligand (a state in which ethyl acetoacetate is bound to molybdenum as a ligand in the case of the formula (23)) to dissociate the β-diketone. After that, the composite material 506 according to the present invention can be obtained by baking in the same way as described above.

Further, when the hydrolysis in the formula (23) is not carried out, the solution 504 may be directly applied on a base material by wet coating, dried, and then, hydrolysis may be carried out with water vapor. After that, the composite material 506 according to the present invention can be obtained by baking in the same way as described above.

As the wet coating described above, dip coating, spin coating, inkjet, and the like can be used here. However, the wet coating is not limited to these.

Embodiment Mode 6

In the present embodiment, a method of manufacturing the composite material according to the present invention, which is described in Embodiment Mode 1 or 2, by a sol-gel method utilizing peptization (also referred to as deflocculation) will be described.

The following formulas (25) to (27) show a scheme of the method. In the present embodiment, a case of manufacturing the composite material (Embodiment Mode 1) using a molybdenum oxide skeleton as the first metal oxide skeleton and 5-diphenylamino-8-quinolinol as the organic compound that has a hole injecting or transporting property and is able to be bound to a molybdenum atom as a chelate ligand, from which the molybdenum oxide is able to accept electrons, will be described as an example. The same basic principle is applied also to a case of using another metal oxide skeleton, a case of using a metal oxide skeleton having two or more kinds of metals, and a case of using another organic compound.

Formula (25)

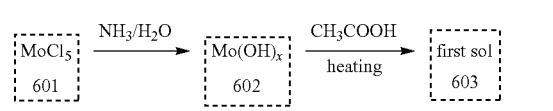

Formula (26)

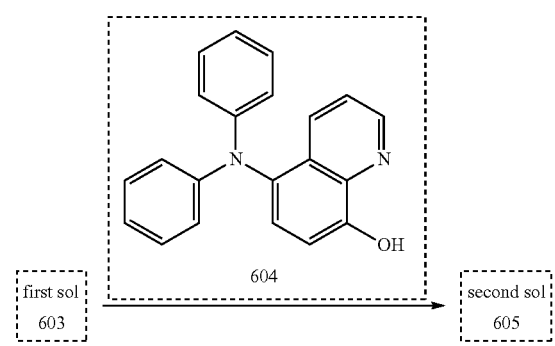

Formula (27)

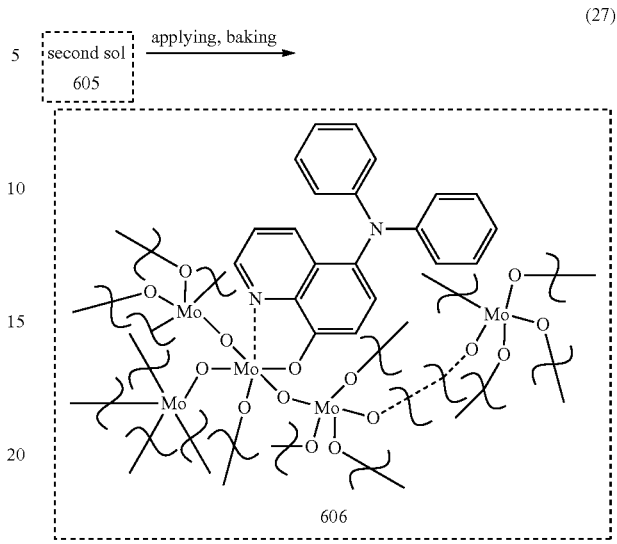

The formula (25) shows a method of dropping ammonia water to a solution of a metal chloride 601 (here, molybdenum chloride (V)) including metal atoms of the first metal oxide to obtain a multinuclear precipitation 602 of a metal hydroxide, and then, adding an acid such as acetic acid and refluxing (peptizing) the multinuclear precipitation 602 to obtain a first sol 603. An appropriate organic solvent may be appropriately added to the first sol 603.

The formula (26) shows a pathway of adding, with respect to 1 mol of the metal (here, molybdenum) of the first sol 603 obtained in accordance with the formula (25), 0.5 mol of an organic compound 604 (5-diphenylamino-8-quinolinol) that gives a hole injecting or transporting property to the composite material according to the present invention to obtain a second sol 605. An appropriate organic solvent may appropriately be added to the second sol 605.

Further, it is preferable that the amount of the organic compound 604 be 0.1 mol or more and 1 mol or less with respect to 1 mol of the metal in the first sol 603.

When a composite material to which a second metal oxide and a third metal oxide are further added is manufactured as the composite material, a sol including the metal of the second metal oxide and the metal of the third metal oxide may be manufactured by peptization in the same way as the first sol 603, and added to the second sol 605. Alternatively, a second metal alkoxide including the metal of the second metal oxide and a third metal alkoxide including the metal of the third metal oxide may be added to the second sol 605. In this case, a stabilization agent and water may be further added appropriately. In addition, when silicon oxide is applied as the third metal oxide, tetraalkoxysilane may be used as the third metal alkoxide, and in this case, it is preferable that the second sol 605 be made acid or alkaline, more preferably, acid at pH 1 to 3.

The formula (27) shows a process of applying and baking the thus obtained second sol 605 to obtain a composite material 606 according to the present invention. For the process, a method of applying the second sol 605 on a base material by wet coating and baking the second sol 605 at a temperature of 100° C. or more but not exceeding 300° C. under atmospheric pressure or reduced pressure can be used. The baking may be performed either in the atmosphere or in an inert gas (for example, nitrogen or argon). In addition, when a stabilization agent is included in the second sol 605, it is preferable to remove the stabilization agent by this baking.

Further, when a stabilization agent is included in the second sol 605, gelation may be conducted in such a way that the second sol 605 is applied on a base material by wet coating, and then, irradiated with ultraviolet light of a wavelength overlapping with an ultraviolet absorption spectrum of a state in which the β-diketone as a stabilization agent is bound to the metal atom as a ligand to dissociate the β-diketone. After that, the composite material 606 according to the present invention can be obtained by baking in the same way as described above.

Further, when a metal alkoxide is included in the second sol 605, the second sol 605 may be applied on a base material by wet coating, dried, and then, hydrolysis may be carried out with water vapor. After that, the composite material 606 according to the present invention can be obtained by baking in the same way as described above.

As the wet coating described above, dip coating, spin coating, inkjet, and the like can be used here. However, the wet coating is not limited to these.

Embodiment Mode 7

In the present embodiment, a method of manufacturing the composite material according to the present invention, which is described in Embodiment Mode 3 or 4, by a sol-gel method using a metal alkoxide will be described.

The following formulas (28) to (31) show a scheme of the method. In the present embodiment, a case of manufacturing the composite material (Embodiment Mode 3) using an aluminum oxide skeleton as the first metal oxide skeleton, 5-diphenylamino-8-quinolinol as the organic compound that has a hole injecting or transporting property and is able to be bound to an aluminum atom as a chelate ligand, and titanium oxide as the second metal oxide that exhibits an electron accepting property to the organic compound will be described as an example. The same basic principle is applied also to a case of using another metal oxide skeleton, a case of using a metal oxide skeleton having two or more kinds of metals, and a case of using another organic compound.

Formula (28)

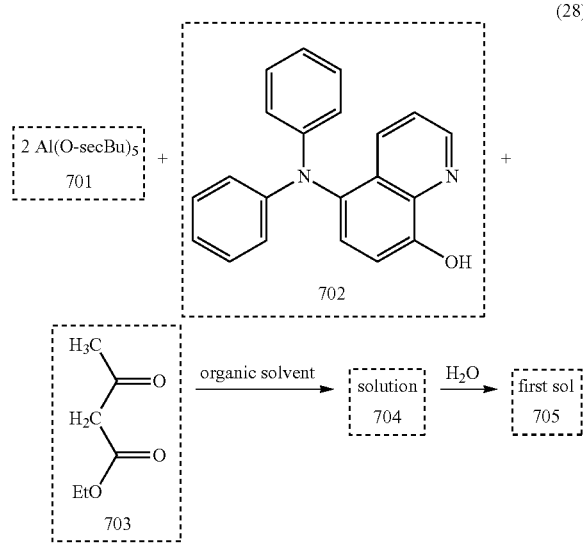

(28)

Formula (29)

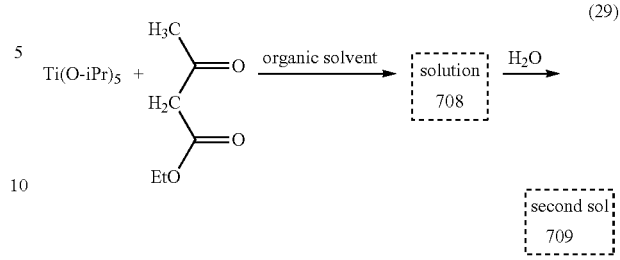

(29)

Formula (30)

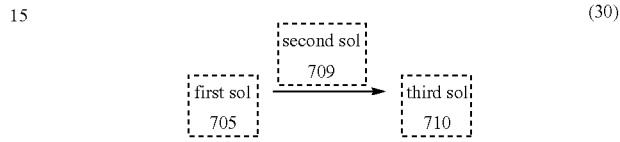

(30)

Formula (31)

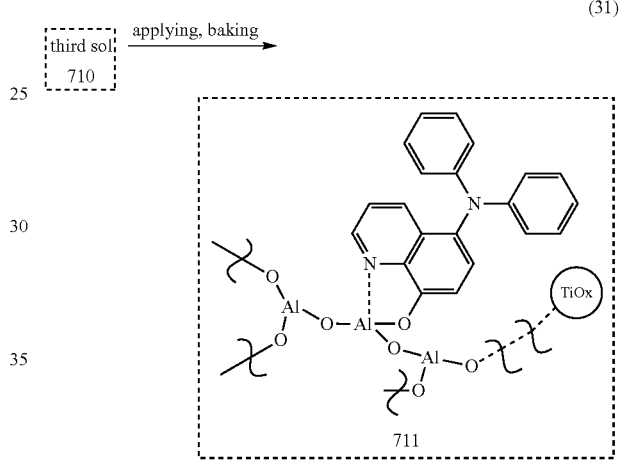

(31)

The formula (28) shows a pathway of dissolving and reacting a metal alkoxide 701 (here, aluminum sec-butoxide) including metal atoms of the first metal oxide, an organic compound 702 (here, 5-diphenylamino-8-quinolinol) that gives a hole injecting or transporting property to the composite material according to the present invention, and a stabilization agent 703 (here, ethyl acetoacetate) at a ratio of 2:1:1 [unit:mol] in an appropriate organic solvent to prepare a solution 704, and carrying out hydrolysis by adding water to obtain a first sol 705. In this case, as the organic solvent, for example, THF, acetonitrile, dichloromethane, dichloroethane, and a mixed solvent of these can be used in addition to lower alcohols such as methanol, ethanol, n-propanol, i-propanol, n-butanol, and sec-butanol. However, the organic solvent is not limited to these.

In addition, it is preferable that the amount of the organic compound 702 be 0.1 mol or more and 1 mol or less with respect to 1 mol of the metal alkoxide 701.

It is to be noted that the stabilization agent 703 is added for preventing precipitation from being produced due to rapid progress of polycondensation when water is added. However, the stabilization agent 703 is not indispensable since the organic compound 702 can act also as a stabilization agent. When the organic compound 702 is small in amount (specifically, 0.5 mol or less with respect to 1 mol of the metal alkoxide 701), however, it is preferable to add the stabilization agent 703 since the stabilization ability is impaired. As the stabilization agent 703, weak chelating agents such as β-diketones, diamines, and aminoalcohols are preferable, and specifically, acethylacetone, benzoylacetone, ethylenediamine, monoethanolamine, and the like can be cited in addition to ethyl acetoacetate shown in the formula (28). However, the stabilization agent 703 is not limited to these. The stabilization agent 703 can exert an effect when the amount of the stabilization agent 703 is 0.5 mol or more with respect to 1 mol of the metal alkoxide 701. In addition, it is preferable that the addition amount of the stabilization agent 703 be 6 mol or less with respect to 1 mol of the metal alkoxide 701 since the metal of the metal alkoxide 701 is hexavalent or less.

It is preferable that the addition amount of the water that is used for the hydrolysis be 2 mol or more and 6 mol or less with respect to 1 mol of the metal alkoxide 701 since the metal of the metal alkoxide 701 is a divalent to hexavalent metal. However, hydrolysis is not indispensable.

The formula (29) shows a pathway of dissolving and reacting a metal alkoxide 706 (here, pentaethoxy molybdenum (V)) including metal atoms of the second metal oxide and a stabilization agent 707 (here, ethyl acetoacetate) at a ratio of 1:1 [unit:mol] in an appropriate organic solvent to prepare a solution 708, and carrying out hydrolysis by adding-water to obtain a sol 709. At this point, the same solvent as in the first sol 705 can be used as the organic solvent.

It is preferable that the addition amount of water that is used for the hydrolysis be 2 mol or more and 6 mol ore less with respect to 1 mol of the metal alkoxide 706 since the metal of the metal alkoxide 706 is a divalent to hexavalent metal. However, hydrolysis is not indispensable.

It is to be noted that the stabilization agent 707 is not indispensable when the hydrolysis is not carried out. As the stabilization agent 707, the materials mentioned above can be used. The stabilization agent 707 can exert an effect when the amount of the stabilization agent 707 is 0.5 mol or more with respect to 1 mol of the metal alkoxide 706. In addition, it is preferable that the addition amount of the stabilization agent 707 be 6 mol or less with respect to 1 mol of the metal alkoxide 706 since the metal of the metal alkoxide 706 is hexavalent or less.

The formula (30) shows a pathway of mixing the first sol 705 and the second sol 709 to obtain a third sol 710. At this point, it is preferable to mix the first sol 705 and the second sol 709 so that the amount of the organic compound 702 is 0.1 or more and 10 mol or less with respect to 1 mol of the second metal alkoxide 706 in the third sol 710. When a composite material to which a third metal oxide is further added is manufactured as the composite material, a third metal alkoxide including the metal of the third metal oxide may be added to the third sol 710. In this case, the stabilization agent mentioned above may be further added appropriately. In addition, when silicon oxide is applied as the third metal oxide, tetraalkoxysilane may be used as the third metal alkoxide, and in this case, it is preferable that a solution including the third metal alkoxide be made acid or alkaline, more preferably, acid at pH 1 to 3.

The formula (31) shows a process of applying and baking the thus obtained third sol 710 to obtain a composite material 711 according to the present invention. For the process, a method of applying the third sol 710 on a base material by wet coating and baking the third sol 710 at a temperature of 100° C. or more but not exceeding 300° C. under atmospheric pressure or reduced pressure can be used. The baking may be performed either in the atmosphere or in an inert gas (for example, nitrogen or argon). In addition, when the third sol 710 includes a stabilization agent, it is preferable to remove the stabilization agent by this baking.

Further, when a β-diketone (here, ethyl acetoacetate) is added as a stabilization agent 703, gelation may be conducted in such a way that the third sol 710 is applied on a base material by wet coating, and then, irradiated with ultraviolet light of a wavelength overlapping with an ultraviolet absorption spectrum of a state in which the β-diketone is bound to the metal atom as a ligand to dissociate the β-diketone. After that, the composite material 711 according to the present invention can be obtained by baking in the same way as described above.

Further, when the hydrolysis in the formula (28) or (29) is not carried out, the third sol 710 may be directly applied on a base material by wet coating, dried, and then, hydrolysis may be carried out with water vapor. After that, the composite material 711 according to the present invention can be obtained by baking in the same way as described above.

As the wet coating described above, dip coating, spin coating, inkjet, and the like can be used here. However, the wet coating is not limited to these.

Embodiment Mode 8

In the present embodiment, a method of manufacturing the composite material according to the present invention, which is described in Embodiment Mode 3 or 4, by a sol-gel method using a metal alkoxide and utilizing peptization will be described.

The following formulas (28) to (31) show a scheme of the method. In the present embodiment, a case of manufacturing the composite material (Embodiment Mode 3) using an aluminum oxide skeleton as the first metal oxide skeleton, 5-diphenylamino-8-quinolinol as the organic compound that has a hole injecting or transporting property and is able to be bound to an aluminum atom as a chelate ligand, and molybdenum oxide as the second metal oxide that exhibits an electron accepting property to the organic compound will be described as an example. The same basic principle is applied also to a case of using another metal oxide skeleton, a case of using a metal oxide skeleton having two or more kinds of metals, and a case of using another organic compound.

Formula (32)

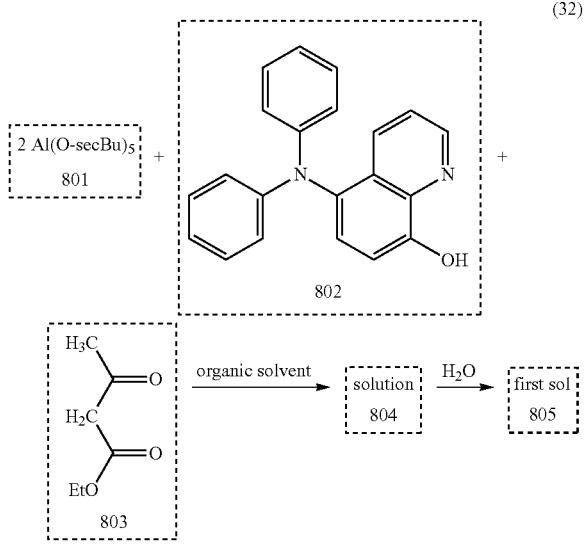

Formula (33)

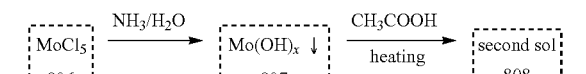

Formula (34)

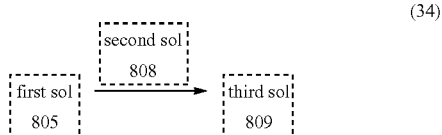

Formula (35)

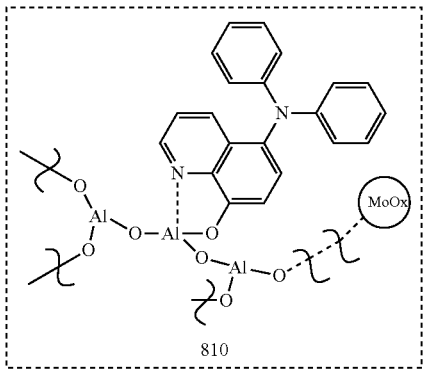

The formula (32) shows a pathway of dissolving and reacting a metal alkoxide 801 (here, aluminum sec-butoxide) including metal atoms of the first metal oxide, an organic compound 802 (here, 5-diphenylamino-8-quinolinol) that gives a hole injecting or transporting property to the composite material according to the present invention, and a stabilization agent 803 (here, ethyl acetoacetate) at a ratio of 2:1:1 [unit:mol] in an appropriate organic solvent to prepare a solution 804, and carrying out hydrolysis by adding water to obtain a first sol 805. In this case, as the organic solvent, for example, THF, acetonitrile, dichloromethane, dichloroethane, and a mixed solvent of these can be used in addition to lower alcohols such as methanol, ethanol, n-propanol, i-propanol, n-butanol, and sec-butanol. However, the organic solvent is not limited to these.

In addition, it is preferable that the amount of the organic compound 802 be 0.1 mol or more and 1 mol or less with respect to 1 mol of the metal alkoxide 801.

It is to be noted that the stabilization agent 803 is added for preventing precipitation from being produced due to rapid progress of polycondensation when water is added. However, the stabilization agent 803 is not indispensable since the organic compound 802 can act also as a stabilization agent. When the organic compound 802 is small in amount (specifically, 0.5 mol or less with respect to 1 mol of the metal alkoxide 801), however, it is preferable to add the stabilization agent 803 since the stabilization ability is impaired. As the stabilization agent 803, weak chelating agents such as β-diketones, diamines, and aminoalcohols are preferable, and specifically, acethylacetone, benzoylacetone, ethylenediamine, monoethanolamine, and the like can be cited in addition to ethyl acetoacetate shown in the formula (32). However, the stabilization agent 803 is not limited to these. The stabilization agent 803 can exert an effect when the amount of the stabilization agent 803 is 0.5 mol or more with respect to 1 mol of the metal alkoxide 801. In addition, it is preferable that the addition amount of the stabilization agent 803 be 6 mol or less with respect to 1 mol of the metal alkoxide 801 since the metal of the metal alkoxide 801 is hexavalent or less.

It is preferable that the addition amount of the water that is used for the hydrolysis be 2 mol or more and 6 mol ore less with respect to 1 mol of the metal alkoxide 801 since the metal of the metal alkoxide 801 is a divalent to hexavalent metal. However, hydrolysis is not indispensable.

The formula (33) shows a method of dropping ammonia water to a solution of a metal chloride 806 (here, molybdenum chloride (V)) including metal atoms of the second metal oxide to obtain a multinuclear precipitation 807 of a metal hydroxide, and then, adding an acid such as acetic acid and refluxing (peptizing) the multinuclear precipitation 807 to obtain a second sol 808. An appropriate organic solvent may be appropriately added to the second sol 808.

The formula (34) shows a pathway of mixing the first sol 805 and the second sol 808 to obtain a third sol 809. At this point, it is preferable to mix the first sol 805 and the second sol 809 so that the amount of the organic compound 802 is 0.1 or more and 10 mol or less with respect to 1 mol of the metal included in the second sol 808 in the third sol 809. When a composite material to which a third metal oxide is further added is manufactured as the composite material, a third metal alkoxide including the metal of the third metal oxide may be added to the third sol 809. In this case, the stabilization agent mentioned above may be further added appropriately. In addition, when silicon oxide is applied as the third metal oxide, tetraalkoxysilane may be used as the third metal alkoxide, and in this case, it is preferable that the third sol 809 be made acid or alkaline, more preferably, acid at pH 1 to 3.

The formula (35) shows a process of applying and baking the thus obtained third sol 809 to obtain a composite material 810 according to the present invention. For the process, a method of applying the third sol 809 on a base material by wet coating and baking the third sol 809 at a temperature of 100° C. or more but not exceeding 300° C. under atmospheric pressure or reduced pressure can be used. The baking may be performed either in the atmosphere or in an inert gas (for example, nitrogen or argon). In addition, when the third sol 809 includes a stabilization agent, it is preferable to remove the stabilization agent by this baking.

Further, when a β-diketone (here, ethyl acetoacetate) is added as a stabilization agent, gelation may be conducted in such a way that the third sol 809 is applied on a base material by wet coating, and then, irradiated with ultraviolet light of a wavelength overlapping with an ultraviolet absorption spectrum of a state in which the β-diketone is bound to the metal atom as a ligand to dissociate the β-diketone. After that, the composite material 810 according to the present invention can be obtained by baking in the same way as described above.

Further, when the hydrolysis in the formula (32) is not carried out, the third sol 809 may be directly applied on a base material by wet coating, dried, and then, hydrolysis may be carried out with water vapor. After that, the composite material 810 according to the present invention can be obtained by baking in the same way as described above.

As the wet coating described above, dip coating, spin coating, inkjet, and the like can be used here. However, the wet coating is not limited to these.

Embodiment Mode 9

Subsequently, a light-emitting element according to the present invention will be described. The light-emitting element according to the present invention is a light-emitting element in which at least one of respective functional layers typified by an electron injecting layer, an electron transporting layer, a hole injecting layer, and a hole transporting layer is formed by using any of the composite materials according to the present invention, which are described in Embodiment Modes 1 to 4.

The light-emitting element according to the present invention includes not only the layer formed by using the composite material described above but also at least a light-emitting layer including a luminescent material, where the layers are interposed between a pair of electrodes constituting the light-emitting element. Luminescence can be obtained from the light-emitting layer by applying a voltage.

The light-emitting element according to the present invention, which has this structure, can be a heat-resistant light-emitting element since at least one of respective functional layers typified by an electron injecting layer, an electron transporting layer, a hole injecting layer, and a hole transporting layer is formed by the composite material having a metal oxide skeleton according to the present invention, and can be a light-emitting element that can be driven with stability for a long period of time.

Further, the conductivity and carrier injecting or transporting property of the composite material are improved since the composite material includes an organic compound that has an electron injecting or transporting property or a hole injecting or transporting property and a metal oxide that is able to accept electrons from the organic compound or donate electrons to the organic compound.

Further, the light-emitting element according to the present invention can be a heat resistant light-emitting element, a light-emitting element that can be driven with stability for a long period of time, a heat-resistant light-emitting element that can be driven with stability for a long period of time by the composite material including an organic compound that has an electron injecting or transporting property or a hole injecting or transporting property and a metal oxide that is able to accept electrons from the organic compound or donate electrons to the organic compound, and it is possible to manufacturing a light-emitting element having low power consumption.

It is to be noted that one of the functional layers of the light-emitting element according to the present invention, which is not formed by using the composite material, may be formed further by using another material. Also in this case, when a layer that is most defective in heat resistance and durability is formed by using the composite material, the heat resistance and the durability can be improved.

It is to be noted that the increase in driving voltage is less even when a light emitting element using the composite material according to the present invention for a functional layer is formed so that the functional layer has a thick film thickness. Therefore, the film thickness of a functional layer between one of a pair of electrodes of a light-emitting element, which is formed first, and a light-emitting layer of the light-emitting element can be made thick so that short circuit of the light-emitting element due to dust and the like can be reduced. When the film thickness is 100 nm or more, this defect can be reduced effectively.

Since the functional layer to be made thick includes the composite material including an organic compound that has an electron injecting or transporting property or a hole injecting or transporting property and a metal oxide that is able to accept electrons from the organic compound or donate electrons to the organic compound according to the present invention, the functional layer is improved in the conductivity and the carrier injecting or transporting property, and thus, short circuit of the light-emitting element due to dust and the like can be reduced without increasing the driving voltage significantly, that is, without increasing the power consumption significantly.

It is to be noted that any one, of the functional layers typified by an electron injecting layer, an electron transporting layer, a hole injecting layer, and a hole transporting layer may be formed by using any of composite materials or two or more functional layers thereof may be formed by using the composite materials. Alternatively, all the functional layers may be formed by using the composite materials. Further, the light-emitting layer can be also formed by using a composite material including an organic compound that is bound to a metal atom in a metal oxide skeleton as a chelate ligand. When the light-emitting layer is formed by using the composite material, a more heat-resistant light-emitting element that can be driven with more stability for a longer period of time can be manufactured. In this case, the light-emitting layer can be formed by applying an organic compound that produces luminescence by applying a voltage and a sol including a material for a metal oxide to the surface on which the light-emitting layer is to be formed and baking the organic compound and the sol. For example, a light-emitting layer in which an organic compound that produces luminescence by applying a voltage is bound to a metal atom in a metal oxide skeleton as a chelate ligand can be formed. It is to be noted this sol is manufactured in accordance with the method of manufacturing the first sol 705 in Embodiment Mode 7 of the present invention, and applied and baked in accordance with the method of applying and baking the composite material according to the present invention. This makes it possible to manufacture a light-emitting layer having a metal oxide skeleton.

Figure 19A:
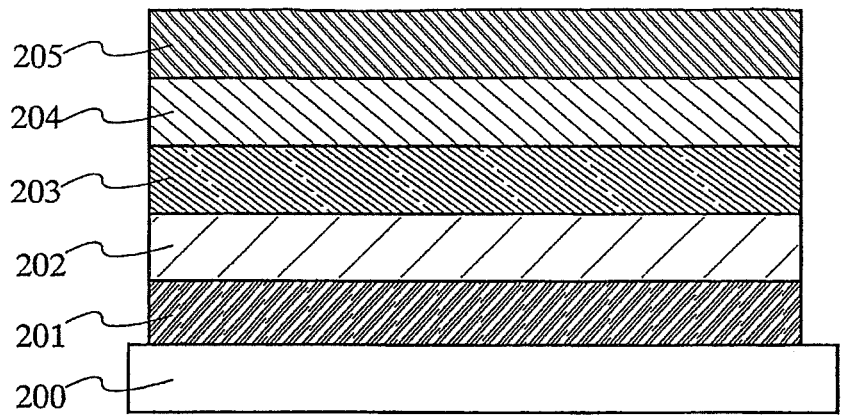
FIGS. 19A and 19B are diagrams illustrating the structures of light-emitting elements according to the present invention.

Subsequently, FIGS. 19A and 19B and FIGS. 20A and 20B show schematic diagrams of examples of light-emitting element according to the present invention. In FIG. 19A, a first electrode 201 is formed on an insulating surface 200 such as a substrate, and further, a hole injecting and/or transporting layer 202 formed by using the composite material according to the present invention (a layer shown by Reference numeral 202 may be divided into double layers of a hole injecting layer and a hole transporting layer), a light-emitting layer 203, and an electron injecting and/or transporting layer 204 formed by using the composite material according to the present invention (a layer shown by Reference numeral 204 may be divided double layers of into a hole injecting layer and a hole transporting layer) are stacked in sequence thereon. Further, a second electrode 205 for a light-emitting element is formed thereon. When the light-emitting element is driven, luminescence can be obtained by applying a voltage so that the first electrode 201 has a higher potential than the second electrode 205 (that is, the first electrode 201 serves as an anode while the second electrode 205 serves as cathode).

The light-emitting layer 203 may be formed by evaporation or by using a composite material including an organic compound that produces luminescence by applying a voltage and a metal oxide skeleton as described above.

In this structure, both of the hole injecting and/or transporting layer 202 and the electron injecting and/or transporting layer 204 are respectively formed by using the composite materials according to the present invention. However, any layers may be formed by using the composite material according to the present invention.

Further, the layer, which is not formed by using the composite material according to the present invention, may be formed by a known method such as evaporation with the use of a known material.

The light-emitting element shown in FIG. 19A can be a heat-resistant light-emitting element that can be driven with stability for a long period of time.

Figure 19B:
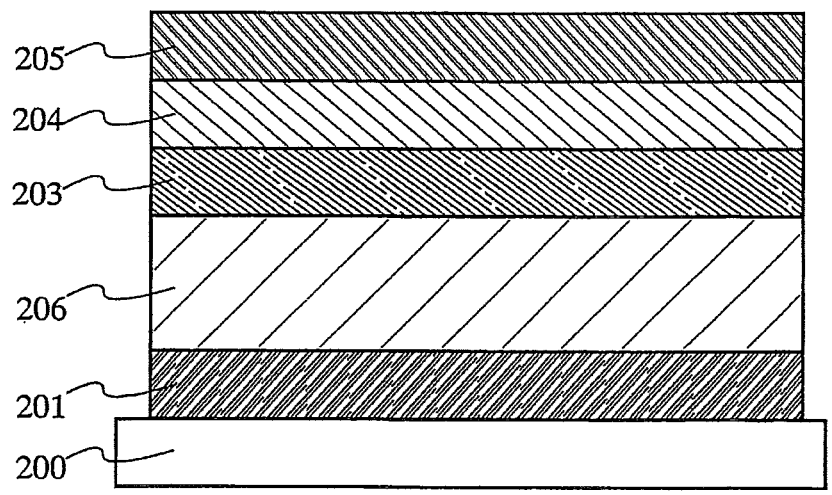

FIG. 19B is a schematic diagram of a light-emitting element that has a hole injecting and/or transporting layer 206 formed by making the hole injecting and/or transporting layer 202 in FIG. 19A thicker. Since the other layers in FIG. 19B are the same as those in FIG. 19A, descriptions there of are omitted. A light-emitting element is formed by stacking ultrathin films. When the first electrode 201 formed at the bottom has a convex portion with a small curvature and a high height (considered to be caused by dust or irregularity of a lower portion), the convex portion is not completely covered with the thin films, and the films are thus broken to cause a failure such as short circuit. On the other hand, when the films are formed to be thicker in order to prevent the failure, the light-emitting element has the disadvantage that the resistance is increased to increase the driving voltage. However, since the composite material according to the present invention includes an organic compound that has an electron injecting or transporting property or a hole injecting or transporting property and a metal oxide that is able to accept electrons from the organic compound or donate electrons to the organic compound, the conductivity of the composite material is high, and increase in the resistance can be thus suppressed even when a film is made thicker. Further, the light-emitting element that has the structure shown in FIG. 19B, which basically has the structure shown in FIG. 19A, is a heat-resistant light-emitting element that can be driven with stability for a long period of time. Accordingly, it is determined that the light-emitting element according to the present invention, which has the structure shown in FIG. 19B, is a heat resistant light-emitting element that can be driven with stability for a long period of time and is less defective.

Figure 20A:
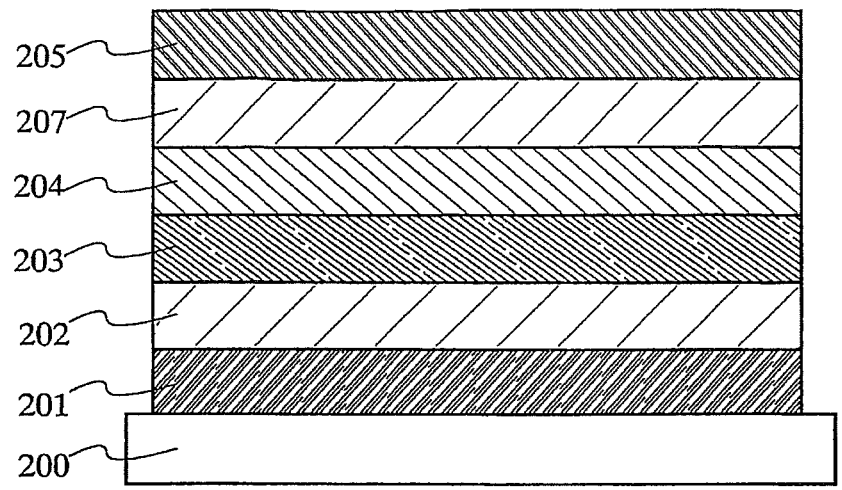

FIG. 20A shows an example in which a hole injecting and/or transporting layer 207 formed by using the composite material according to the present invention is interposed between the electron injecting and/or transporting layer 204 and the second electrode 205 in FIG. 19A. The hole injecting and/or transporting layer 207 formed by using the composite material according to the present invention is formed by using a composite material that uses an organic compound that has an excellent hole injecting or transporting property as the organic compound in the composite material and further includes a substance that is cable to accept electrons from the organic compound, that is, by using a material that is used for a hole injecting layer or a hole transporting layer under normal circumstances.

However, by stacking the electron injecting and/or transporting layer 204 formed by using the composite material according to the present invention and the hole injecting and/or transporting layer 207 formed by using the composite material according to the present invention in sequence on the side of the electrode that functions as a cathode (the second electrode 205) on the basis of the light-emitting layer 203, when a voltage is applied, an electron generated in electron injecting and/or transporting layer 204 formed by using the composite material according to the present invention is injected into the light-emitting layer 203 while a hole generated in the hole injecting and/or transporting layer 207 formed by using the composite material according to the present invention is injected into the electrode that functions as a cathode (the second electrode 205), and current thus flows so that luminescence can be obtained.

Alternatively, when this structure is formed on the side of the electrode that functions as an anode (the first electrode 201) on the basis of the light-emitting layer 203, a layer formed by using the composite material according to the present invention, which can be used as an electron injecting and/or transporting layer, and a layer formed by using the composite material according to the present invention, which can be used as a hole injecting and/or transporting layer, can be stacked in sequence in the same way. It is to be noted that this structure may be provided on the either or both sides of the electrode that functions as a cathode (the second electrode 205) and the electrode that electrode that functions as a cathode (the second electrode 205) and the electrode that functions as an anode (the first electrode 201) on the basis of the light-emitting layer 203.

In the case of the light-emitting element that has this structure, materials for the first electrode 201 and the second electrode 205 can be selected without any regard for work function, and thus, more suitable electrodes can be selected depending on structures such as a reflective electrode and a transparent electrode.

Figure 20B:
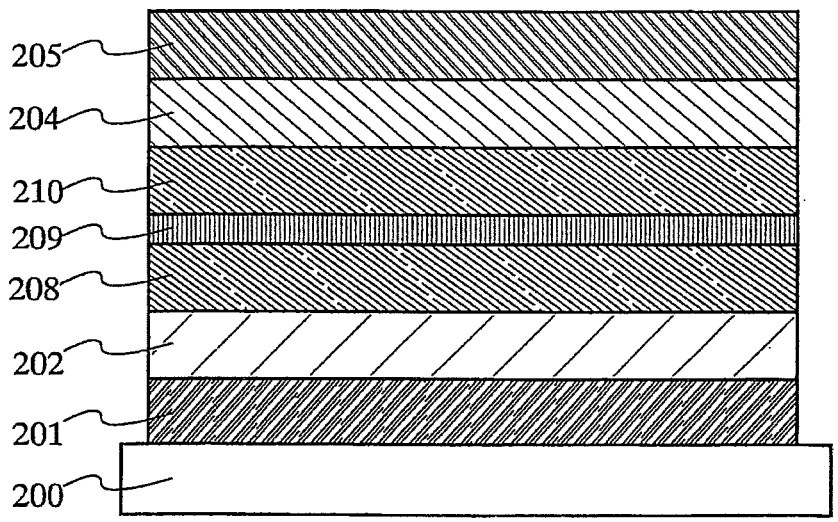

FIG. 20B shows an example of a light-emitting element that is able to provide white light emission, where a first light-emitting layer 208, a separation layer 209, and a second light-emitting layer 210 are provided between the hole injecting and/or transporting layer 202 and the electron injecting and/or transporting layer 204 in FIG. 19A. White light emission can be obtained by forming the first light-emitting layer 208 and the second light-emitting layer 210 with the use of materials that provide luminescent colors that have a relationship of complementary colors with each other, such as red and blue-green.

The separation layer 209 can be formed by a hole transporting material, an electron transporting material, a bipolar material, a hole blocking material, a carrier generating material, or the like, provided that the separation layer 209 has a light-transmitting property. The separation layer 209 is provided for the purpose of preventing either the first light-emitting layer 208 or the second light-emitting layer 210 from emitting stronger light due to energy transfer. As long as this phenomenon does not occur, it is not particularly necessary to provide the separation layer 209.

The light-emitting element that has the structure shown in FIG. 20B is able to provide white light emission, and is a heat-resistant light-emitting element that can be driven with stability for a long period of time. This element can be preferably used for lighting.

Further, the present embodiment can be used in combination with the other embodiment as long as there is no discrepancy.

Embodiment Mode 10

In the present embodiment, a display device according to the present invention will be described while describing a method for manufacturing the display device with reference to FIGS. 11A to 11E and FIGS. 12A to 12C. It is to be noted the display device according to the present invention can be applied also to a passive-matrix display device although an example of manufacturing an active-matrix display device is described in the present embodiment.

Figure 11A:
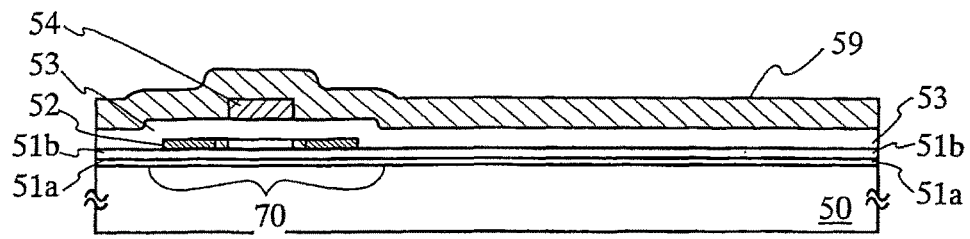
FIGS. 11A to 11E are diagrams illustrating a manufacturing process of a thin film light-emitting element according to the present invention.

First, after forming a first base insulating layer 51a and a second base insulating layer 51b over a substrate 50, a semiconductor layer is further formed on the second insulating layer 51b (FIG. 11A).

As a material for the substrate 50, glass, quartz, plastic (such as polyimide, acrylic, polyethylene terephthalate polycarbonate, polyacrylate, or polyethersulfone), and the like can be used. The substrate may be used after being polished by CMP or the like, if necessary. In the present embodiment, a glass substrate is used.

The first base insulating layer 51a and the second base insulating layer 51b are provided in order to prevent an element that has a damaging effect on characteristics of a semiconductor film, such as an alkali metal or an alkaline earth metal contained in the substrate 50, from diffusing into the semiconductor layer. As materials for the first and second base insulating layer 51a and 51b, silicon oxide, silicon nitride, silicon oxide containing nitrogen, silicon nitride containing oxygen, and the like can be used. In the present embodiment, the first base insulating layer 51a and the second base insulating layer 51b are formed by using silicon nitride, silicon oxide respectively. Although a base insulating layer is formed by the two layers of the first base insulating layer 51a and the second insulating layer 51b in the present embodiment, the base insulting layer may be formed by a single layer, or by a multilayer of two or more layers. Alternatively, it is not necessary to provide the base insulating film when diffusions of impurities from the substrate are negligible.

The subsequently formed semiconductor layer is obtained by performing laser crystallization of an amorphous silicon film in this embodiment. An amorphous silicon film is formed on the second base insulating layer 51b to have a film thickness of 25 to 100 nm (preferably, 30 to 60 nm). As a manufacturing method thereof, a known method such as sputtering, low pressure CVD, or plasma CVD can be used. Subsequently, heat treatment at 500° C. for one hour is performed for dehydrogenation.

Then, the amorphous silicon film is crystallized with the use of a laser irradiation system to form a crystalline silicon film. For the laser crystallization in the present embodiment, an excimer laser is used, an emitted laser beam is processed to be a linear beam spot by using an optical system, and the amorphous silicon film is irradiated with the linear beam spot to be a crystalline silicon film, which is used as the semiconductor layer.

As another method for crystallizing an amorphous silicon film, there are also a method of performing crystallization only by heat treatment and a method of performing crystallization by heat treatment with the use of a catalytic element that promotes crystallization. Nickel, iron, palladium, tin, lead, cobalt, platinum, copper, gold, and the like can be used as the element that promotes crystallization. By using the element, crystallization can be performed at a lower temperature in a shorter time, as compared with a case of performing crystallization only by heat treatment. Therefore, a glass substrate or the like is less damaged. In the case of performing crystallization only by heat treatment, a highly heat-resistant quartz substrate or the like may be used as the substrate 50.

Subsequently, doping with a small amount of impurity, so-called channel doping, is performed to the semiconductor layer in order to control a threshold voltage, if necessary. The semiconductor layer is doped with an n-type or p-type impurity (phosphorus, boron, or the like) by ion doping or the like in order to obtain a required threshold voltage.

After that, as shown in FIG. 11A, the semiconductor layer is shaped into a predetermined shape to obtain an island-shaped semiconductor layer 52. The semiconductor layer is shaped in such a way that a photoresist is applied to the semiconductor layer, exposed to light to have a predetermined mask shape, and baked to form a resist mask on the semiconductor layer; and etching is performed by using the mask.

Subsequently, a gate insulating layer 53 is formed to cover the semiconductor layer 52. The gate insulating layer 53 of an insulating layer containing silicon is formed by plasma CVD or sputtering to have a film thickness 40 to 150 nm. In the present embodiment, the gate insulating layer 53 is formed by using silicon oxide.

Next, a gate electrode 54 is formed on the gate insulating layer 53. The gate electrode 54 may be formed by using an element selected from tantalum, tungsten, titanium, molybdenum, aluminum, copper, chromium, and niobium or using an alloy material or compound material mainly containing the element. Alternatively, a semiconductor film typified by a polycrystalline silicon film doped with an impurity element such as phosphorus may be used.

In the present embodiment, the gate electrode 54 is formed by a single layer. However, a laminated structure of two or more layers, for example, tungsten for a lower layer and molybdenum for an upper layer, may be employed. Also when the gate electrode 54 is formed to have a laminated structure, the materials mentioned in the above paragraph are preferably used. Further, the combination of the materials may be appropriately selected. The process for the gate electrode 54 is performed by etching with the use of a mask using a photoresist.

Subsequently, with the gate electrode 54 as a mask, the semiconductor layer 52 is doped with a high concentration of impurity. In this way, a thin film transistor including the semiconductor layer 52, the gate insulating layer 53, and the gate electrode 54 is formed.

It is to be noted that the manufacturing process of the thin film transistor 70 is not particularly limited, and may be appropriately changed so that a transistor that has a desired structure can be manufactured.

In the present embodiment, a top-gate thin film transistor using a crystalline silicon film crystallized by using laser crystallization issued. However, a bottom-gate thin film transistor using an amorphous semiconductor film can be used for a pixel portion. Silicon germanium as well as silicon can be used for the amorphous semiconductor. In the case of using silicon germanium, it is preferable that the concentration of germanium be approximately 0.01 to 4.5 atomic %.

In addition, a microcrystalline semiconductor (semi-amorphous semiconductor) film in which a crystal grain of 0.5 to 20 nm can be observed within an amorphous semiconductor may be used. A microcrystal in which a crystal grain of 0.5 to 20 nm can be observed is also referred to as a so-called microcrystal (µc).

Semi-amorphous silicon (also referred to as SAS) that is a semi-amorphous semiconductor can be obtained by glow discharge decomposition of a silicide gas. As the silicide gas, $SiH_4$ is typical, and in addition, $Si_2H_6$, $SiH_2Cl_2$, $SiHCl_3$, $SiCl_4$, $SiF_4$, and the like can also be used. SAS can be formed easily by diluting the silicide gas with hydrogen or with hydrogen and one or more rare gas elements selected from helium, argon, krypton, and neon. It is preferable to dilute the silicide gas so that the dilution ratio ranges from 10 to 1000 times. Reaction production of a film by glow discharge decomposition may be performed under a pressure in the range of 0.1 to 133 Pa. A high-frequency power of 1 to 120 MHz, preferably 13 to 60 MHz, may be supplied to generate glow discharge. It is preferable that the substrate heating temperature be 300° C. or less, and a substrate heating temperature of 100 to 250° C. is preferred.

The thus formed SAS has a raman spectrum shifted to a lower frequency side than 520 cm$^{-1}$. In X-ray diffraction, diffraction peaks of (111) and (220) that are considered due to a crystal lattice of silicon are observed. The SAS contains at least 1 atomic % or more of hydrogen or halogen to terminate a dangling bond. It is desirable that the concentration of an atmospheric component impurity such as oxygen, nitrogen, or carbon is $1 \times 10^{20}/cm^3$ or less as an impurity element in the film, and particularly, the oxygen concentration is made to be $5 \times 10^{19}/cm^3$ or less, preferably $1 \times 10^{19}/cm^3$ or less. When the SAS is used for a TFT, the field effect mobility thereof is $\mu=1$ to 10 cm$^2$/Vsec.

In addition, this SAS may be further crystallized with a laser.

Subsequently, an insulating film (hydrogenation film) 59 is formed by using silicon nitride to cover the gate electrode 54 and the gate insulating layer 53. After forming the insulating film (hydrogenation film) 59, heating is performed at 480° C. for about an hour to activate the impurity elements and hydrogenate the semiconductor layer 52.

Figure 11B:
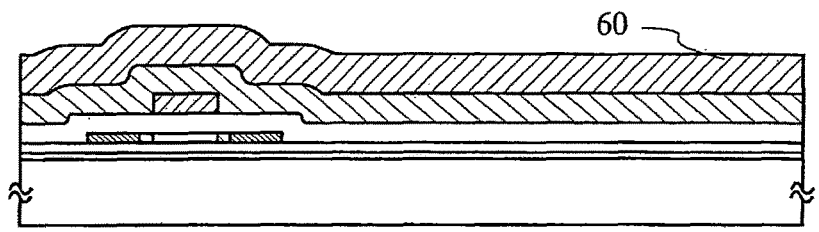

Subsequently, a first interlayer insulating layer 60 is formed to cover the insulating film (hydrogenation film) 59. As a material for forming the first interlayer insulating layer 60, silicon oxide, acrylic, polyimide, siloxane, a low-k material, and the like are preferably used. In the present embodiment, silicon oxide is formed as the first interlayer insulating layer 60 (FIG. 11B).

Figure 11C:
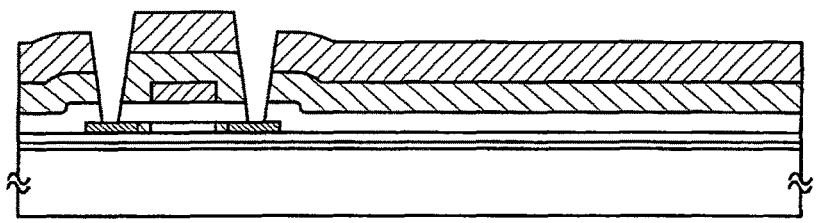

Next, contact holes reaching the semiconductor layer are formed. The Contact holes can be formed by etching with the use of a resist mask until exposing the semiconductor layer 52, and can be formed by either wet etching or dry etching. It is to be noted that etching may be performed once or divided into more than once according to the condition. When etching is performed more than once, both wet etching and dry etching may be used (FIG. 11C).

Figure 11D:
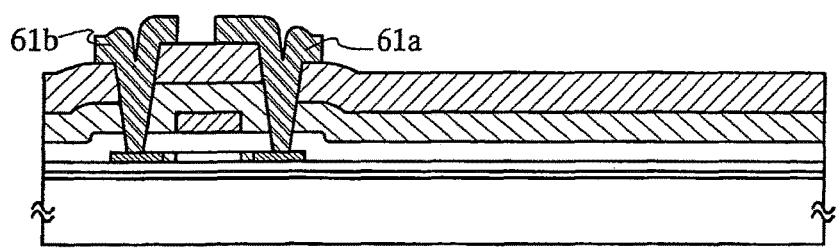

Then, a conductive layer is formed to cover the contact holes and the interlayer insulating layer 60. The conductive layer is processed into a predetermined shape to form a connecting portion 61a, a wiring 61b, and the like. This wiring may be a single layer of aluminum, copper, an alloy of aluminum, carbon, and nickel, an alloy of aluminum, carbon, and molybdenum, or the like. However, a laminated structure of molybdenum, aluminum, and molybdenum formed in the order of formation, a laminated structure of titanium, aluminum, titanium in the order of formation, and a laminated structure of titanium, titanium nitride, aluminum, and titanium in the order of formation may be employed (FIG. 11D).

Figure 11E:
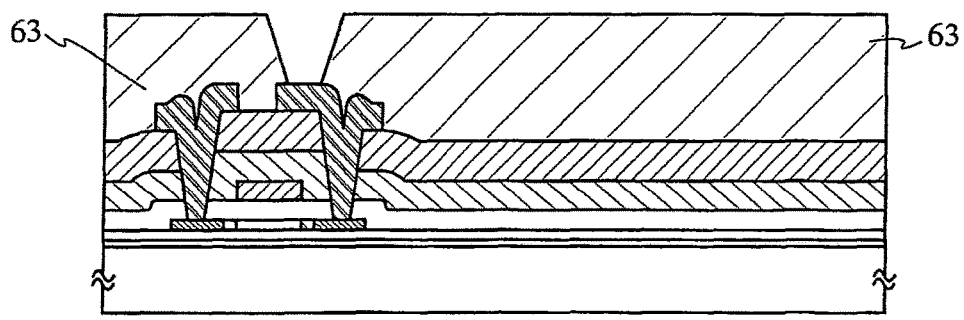

After that, a second interlayer insulating layer 63 is formed to cover the connection portion 61a, the wiring 61b, and the first interlayer insulating layer 60. As a material for the second interlayer insulating layer 63, a self-flatness coating film such as acrylic, polyimide, or siloxane are preferably used. In the present embodiment, siloxane is used for the second interlayer insulating layer 63 (FIG. 11E).

Subsequently, an insulating layer may be formed on the second interlayer insulating layer 63 with the use of silicon nitride or the like. This insulating layer is formed for preventing the second interlayer insulating layer 63 from being etched more than necessary in etching a pixel electrode later. Therefore, when the ratio between the etching rates for the pixel electrode and the second interlayer insulating layer 63 is large enough, it is not particularly necessary to provide the insulating layer. Subsequently, a contact hole reaching the connecting portion 61a through the second interlayer insulating layer 63.

Then, after forming a light-transmitting conductive layer to cover the contact hole and the second interlayer insulating layer 63 (or the insulating layer), the light-transmitting conductive layer is processed to form a first electrode 64 for a thin film light-emitting element, where the first electrode 64 is electrically connected to the connecting portion 61a.

For the first electrode 64, a conductive film can be formed by using a material, for example, conductive metals such as aluminum (Al), silver (Ag), gold (Au), platinum (Pt), nickel (Ni), tungsten (W), chromium (Cr), molybdenum (Mo), iron (Fe), cobalt (Co), copper (Cu), palladium (Pd), lithium (Li), cesium (Cs), magnesium (Mg), calcium (Ca), strontium (Sr), and titanium (Ti), alloys of these metals, a nitride (TiN) of a metal material, or metal oxides such as indium tin oxide (ITO), ITO containing silicon (ITSO), IZO (indium zinc oxide) of iridium oxide mixed with zinic oxide (ZnO).

Figure 12A:
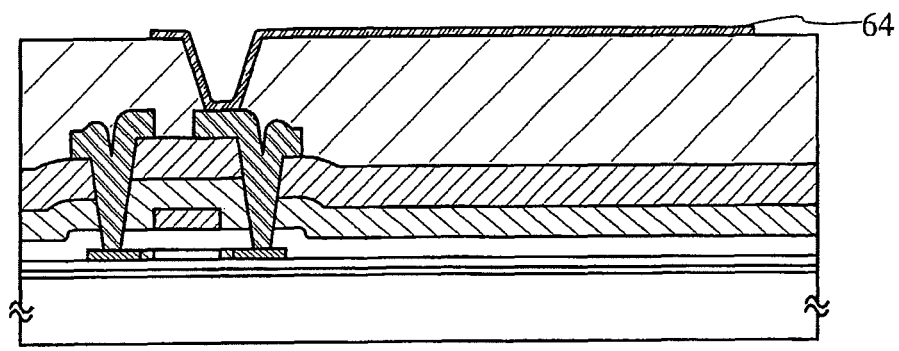
FIGS. 12A to 12C are diagrams illustrating the manufacturing process of the thin film light-emitting element according to the present invention.

In addition, the electrode from which luminescence is extracted is formed by using a light-transmitting conductive film, and an ultrathin film of a metal such as Al or Ag is used besides metal oxides such as ITO, ITSO, and IZO. In the case of extracting luminescence from a second electrode 67 to be formed later, a material that has a high reflectivity (such as Al and Ag) can be used for the first electrode 64. In the present embodiment, ITSO is used for the first electrode 64 (FIG. 12A).

Figure 12B:
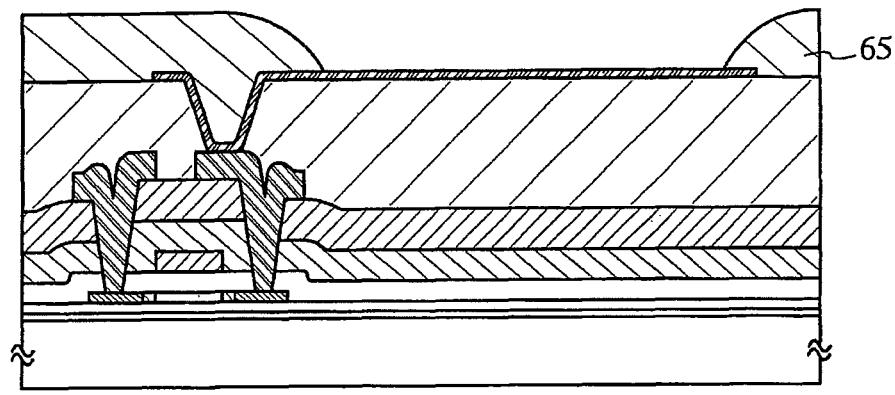
Figure 12C:
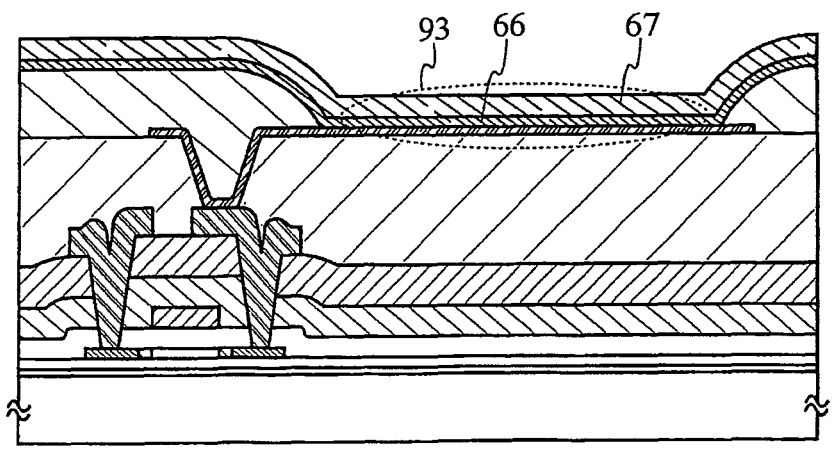

Next, an insulating film including an organic material or an inorganic material is formed to cover the second interlayer insulating layer 63 (or the insulating layer) and the first electrode 64. Subsequently, the insulating layer is processed so that a portion of the first electrode 64 is exposed, and a partition 65 is thus formed. As a material for the partition 65, a photosensitive organic material (such as acrylic and polyimide) is preferably used. However, a non-photosensitive organic material or inorganic material may be used for forming the partition 65. Further, as a material for the partition 65, a black pigment or dye such as black titanium or carbon nitride may be dispersed with the use of a dispersant to make the partition 65 black like a black matrix. It is preferable that an edge surface of the partition 65 toward the first electrode 64 have a curvature and a tapered shape in which the curvature is continuously changing (FIG. 12B).

Next, a hole injecting layer is manufactured by using a composite material according to the present invention to cover the first electrode 64, which is not covered with the partition 65. Specifically, a composite material that includes a transition metal oxide and an organic compound having an arylamine skeleton is used. This hole injecting layer may be manufactured in accordance with the method described in any of Embodiment Modes 5 to 8, and inkjet is preferably used for coating. Next, a light-emitting layer is manufactured by a known method. Coating is performed by inkjet in the same way. Subsequently, an electron injecting layer is manufactured by using a composite material according to the present invention. For example, a composite material that includes an alkali metal oxide and an organic compound having a pyridine skeleton is used. This electron injecting layer may be manufactured in accordance with the method described in any of Embodiment Modes 5 to 8, and inkjet is preferably used for coating.

Subsequently, the second electrode 67 is formed to cover a light-emitting laminated body 66 (also referred to as an electroluminescence layer) which consists of the hole injecting layer, the light-emitting layer, the electron injecting layer, and the like. In this way, a light-emitting element 93 formed by sandwiching the light-emitting laminated body 66 including the light-emitting layer between the first electrode 64 and the second electrode 67 can be manufactured, and luminescence can be obtained by applying a higher potential to the first electrode 64 than to the second electrode 67. As an electrode material to be used for forming the second electrode 67, the same materials as for the first electrode 64 can be used. In the present embodiment, aluminum is used for the second electrode.

The light-emitting element, which has the structure described above, is a heat-resistant and durable panels and modules since the composite material having the metal oxide skeleton is used for light-emitting elements. Further, since the composite material according to the present invention includes an organic compound that has an electron injecting or transporting property or a hole injecting or transporting property and a metal oxide that is able to accept electrons from the organic compound or donate electrons to the organic compound, light-emitting elements that have an improved electron injecting or transporting property or an improved hole injecting or transporting property and further has improved conductivity can be provided.

Further, when the functional layer on the first electrode is formed to be 100 nm or more in thickness with the use of the composite material that has an improved electron injecting or transporting property or an improved hole injecting or transporting property and further has improved conductivity, occurrence of defects due to dust and the like on the first electrode can be reduced without causing a significant increase in the driving voltage.

In addition, the hole injecting layer is formed on the first electrode 64 in the present embodiment. However, an electron injecting layer may be provided on the first electrode 64 to have a reversed laminated structure. In this case, luminescence can be obtained by making a voltage that is applied to the first electrode 64 lower than a potential that is applied to the second 67.

After that, a silicon oxide film containing nitrogen is formed by plasma CVD as a first passivation film by plasma CVD. In the case of using a silicon oxide film containing nitrogen, a silicon oxynitride film that is manufactured by using $SiH_4$, $N_2O$, and $NH_3$, a silicon oxynitride film that is manufactured by using $SiH_4$ and $N_2O$, or a silicon oxynitride film that is manufactured by using gas of $SiH_4$ and $N_2O$ diluted with Ar may be formed by plasma CVD. Naturally, the structure of the first passivation film is not limited to a single layer structure. The first passivation film may have a single layer structure or laminated structure using another insulating layer including silicon. In addition, a multilayer film of a carbon nitride film and a silicon nitride film, a multilayer film of a styrene polymer, a silicon nitride film, or a diamond like carbon film may be formed instead of the silicon oxide film containing nitrogen.

Subsequently, sealing of a display portion is performed to protect the light-emitting element 93 from materials, such as water, that accelerate deterioration. In the case of using an opposed substrate for sealing, the opposed substrate is attached with the use of a sealing material of insulation so that an external connecting portion is exposed. The space between the opposed substrate and the element substrate may be filled with an inert gas such as dried nitrogen, or the sealing material may be applied to the whole surface of a pixel portion to attach the opposed substrate. It is preferable to use an ultraviolet curing resin or the like for the sealing material. The sealing material may be mixed with a drying agent or particles for keeping a gap between the substrates constant. Then, a light-emitting device is completed by attaching a flexible printed circuit to the external connecting portion.

Examples of the structure of the thus manufactured display device will be described with reference to FIGS. 13A and 13B. It is to be noted that the same reference numeral is assigned to portions that carry out the same function even when the shapes of the portions are different from each other, and the description there of can be omitted. In the present embodiment, the thin film transistor 70 that has an LDD structure is connected to the light-emitting element 93 via the connecting portion 61a.

Figure 13A:
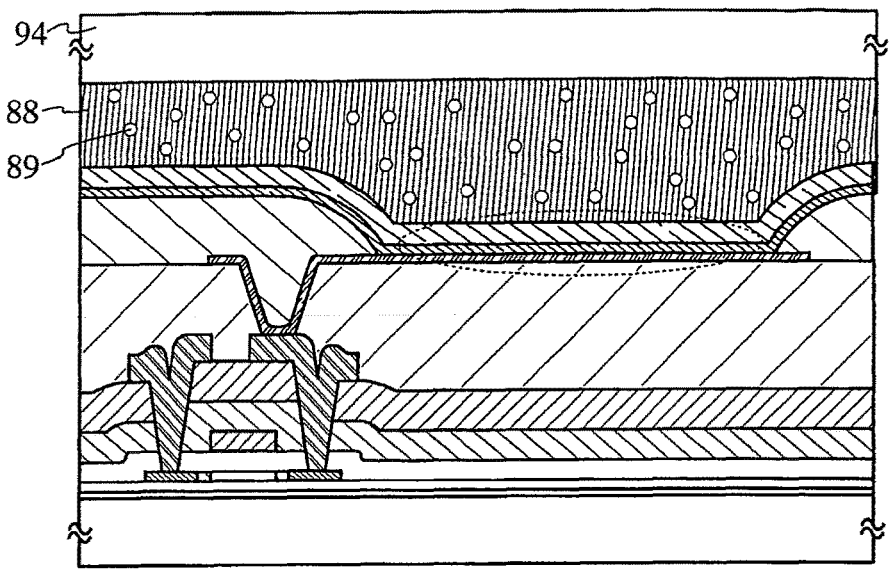
FIGS. 13A and 13B are diagrams illustrating the structure of display devices.

FIG. 13A shows a structure in which the first electrode 64 is formed by using a light-transmitting conductive film, and light emitted from the light-emitting laminated body 66 is extracted from the substrate 50 side. Further, reference numeral 94 denotes an opposed substrate, which is attached to the substrate 50 with the use of a sealing material or the like after the light-emitting element 93 is formed. A light-transmitting resin 88 or the like is provided between the opposed substrate 94 and the light-emitting element 93 for sealing so that the light-emitting element 93 can be prevented from being deteriorated due to moisture. In addition, it is preferable that the resin 88 be hygroscopic. Further, it is more preferable to disperse a highly light-transmitting drying agent 89 in the resin 88 since the effect of moisture can be further suppressed.

Figure 13B:
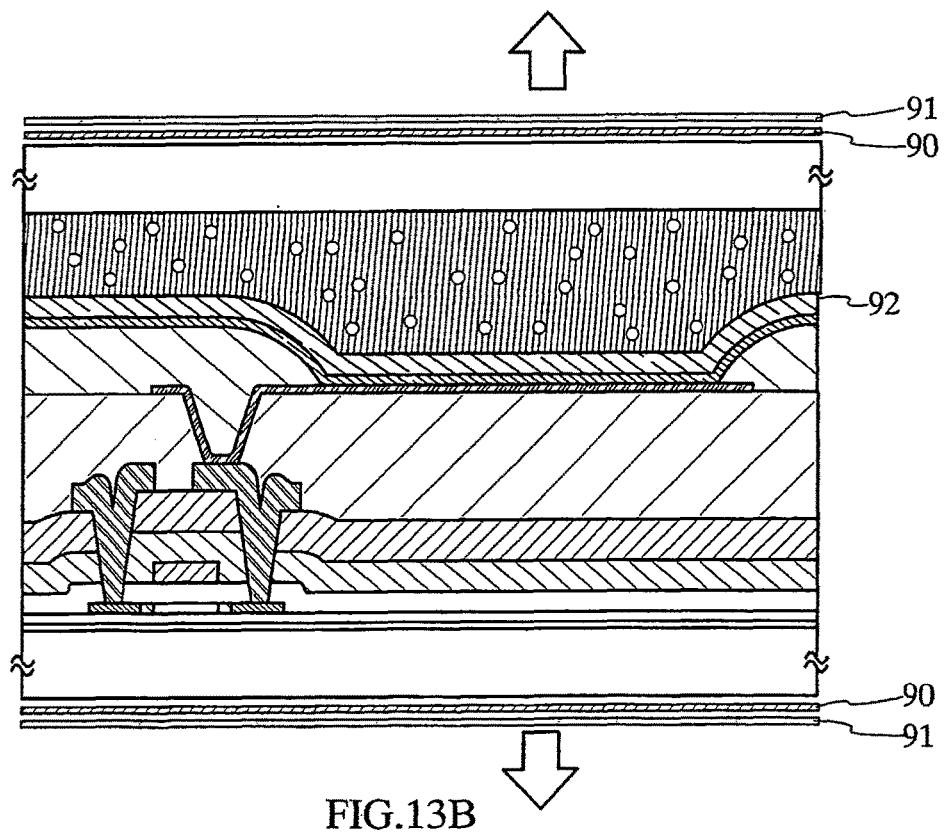

FIG. 13B shows a structure in which both the first electrode 64 and the second electrode 67 are each formed by a light-transmitting conductive film, and light can be extracted from both the substrate 50 and the opposed substrate 94. Further, in this structure, the screen can be prevented from being seen through by providing polarization plates 90 on the outer sides of the substrate 50 and the opposed substrate 94, and the visibility is thus improved. On the outer sides of the polarization plates 90, protective films 91 are preferably provided.

It is to be noted that either an analog video signal or a digital video signal may be used for the display device according to the present invention, which has a display function. In the case of a digital video signal, the video signal uses either voltage or current. When a light-emitting element emits light, a video signal to be input to the pixel is either a constant-voltage signal or a constant-current voltage, and either the voltage that is applied to the light-emitting element or the current that flows in the light-emitting element is constant in the case of the constant-voltage signal. Either the voltage that is applied to the light-emitting element or the current that flows in the light-emitting element is constant in the case of the constant-current signal. The driving in which the voltage that is applied to the light-emitting element is constant is referred to as constant voltage driving, and the driving in which the current that flows in the light-emitting element is constant is referred to as constant-current driving. In the constant-current driving, a constant current flows regardless of change in the resistance of the light-emitting element. Any of the driving methods described above may be used For the light-emitting display device according to the present invention.

The present embodiment can be used appropriately in combination with the other embodiments.

Embodiment Mode 11

Figure 14A:
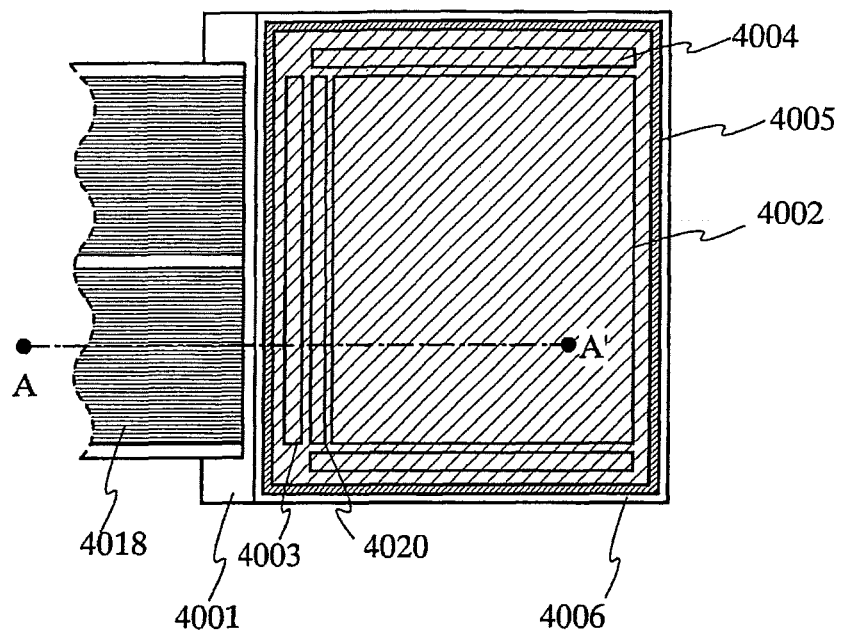
FIGS. 14A and 14B are a top view and a cross-sectional view of a light-emitting device according to the present invention.
Figure 14B:
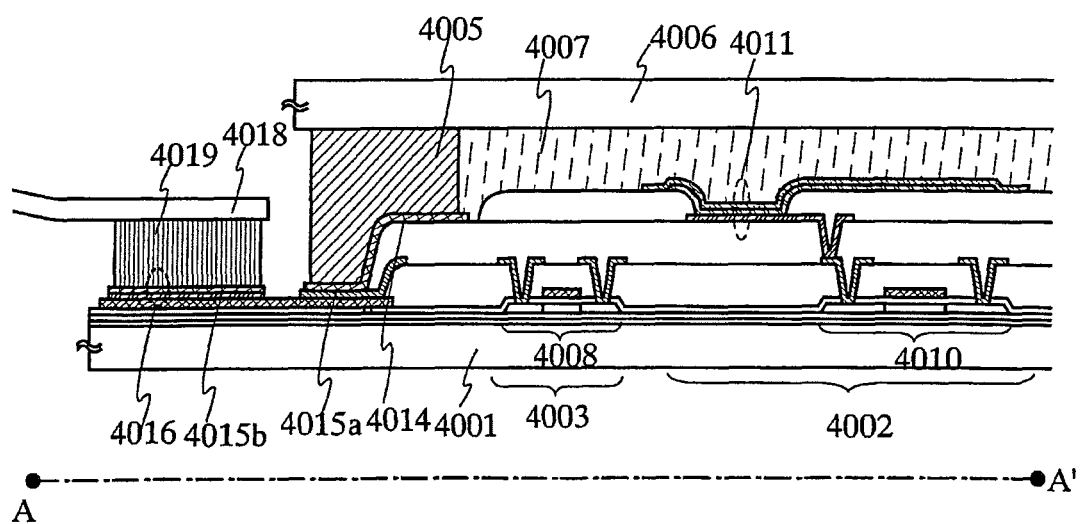

In the present embodiment, the appearance of a panel of a light-emitting device that corresponds to one embodiment of the present invention will be described with reference to FIGS. 14A and 14B. FIG. 14A is a top view of a panel in which transistors 4008 and 4010 and a light-emitting element 4011 that are formed over a substrate 4001 are sealed with a sealing agent 4005 between the substrate 4001 and an opposed substrate 4006. FIG. 14B corresponds to a cross-sectional view of FIG. 14A. The structure of the light-emitting element 4011 in the panel has the structure described in Embodiment Mode 9.

The sealing agent 4005 is provided so as to surround a pixel portion 4002, a signal line driver circuit 4003, and a scan line driver circuit 4004 that are provided over the substrate 4001. Further, the opposed substrate 4006 is provided over the pixel portion 4002, the signal line driver circuit 4003, and the scan line driver circuit 4004. Accordingly, the pixel portion 4002, the signal line driver circuit 4003, and the scan line driver circuit 4004 are sealed, together with a filling agent 4007, with the substrate 4001, the sealing agent 4005, and the opposing substrate 4006.

Further, each of the pixel portion 4002, the signal line driver circuit 4003, and the scan line driver circuit 4004 over the substrate 4001 has a plurality of thin film transistors. In FIG. 14B, the thin film transistor 4008 included in the signal line driver circuit 4003 and the thin film transistor 4010 included in the pixel portion 4002 are shown.

Furtherer, the light-emitting element 4011 is electrically connected to the thin film transistor 4010.

Further, a leading wiring 4014 corresponds to a wiring for supplying signals or a power supply voltage to the pixel portion 4002, the signal driver circuit 4003, and the scan line driver circuit 4004. The lead wiring 4014 is connected to a connecting terminal 4016 via leading wirings 4015a and 4015b. The connecting terminal 4016 is electrically connected to a terminal of a flexible printed circuit (FPC) 4018 via an anisotropic conductive film 4019.

As the filling agent 4007, ultraviolet curing resins and thermal curing resin can be used besides inert gases such as nitrogen or argon, and polyvinylchloride, acrylic, polyimide, epoxy resin, silicon resin, polyvinyl butylal, or ethylene vinylene acetate can be used.

It is to be noted that a panel in which a pixel portion that has a light-emitting element is formed and a module in which an IC is mounted on the panel are included in the category of the display device according to the present invention.

Panels and modules that have the structure described in the present embodiment are heat-resistant and durable panels and modules since the composite material having the metal oxide skeleton is used for light-emitting elements. Further, since the composite material according to the present invention includes an organic compound that has an electron injecting or transporting property or a hole injecting or transporting property and a metal oxide that is able to accept electrons from the organic compound or donate electrons to the organic compound, panels and modules that have an improved electron injecting or transporting property or an improved hole injecting or transporting property and further has improved conductivity can be provided.

Further, when the functional layer on the first electrode is formed to be 100 nm or more in thickness with the use of the composite material that has an improved electron injecting or transporting property or an improved hole injecting or transporting property and further has improved conductivity, occurrence of defects due to dust and the like on the first electrode can be reduced without causing a significant increase in the driving voltage.

The present embodiment can be used appropriately in combination with the other embodiments.

Embodiment Mode 12

Electronic devices according to the present invention, which are each mounted with a module like the example shown in Embodiment Mode 11, include a video camera, a digital camera, a goggle-type display (head mount display), a navigation system, a sound reproduction device (a car audio component or the like), a computer, a game machine, a personal digital assistance (a mobile computer, a cellular phone, a portable game machine, an electronic book, or the like), and an image reproduction device equipped with a recording medium (specifically, a device equipped with a display, which can reproduce a recording medium such as a Digital Versatile Disc (DVD) and display the image). Specific examples of these electronic devices are shown in FIGS. 15A to 15E.

Figure 15A:
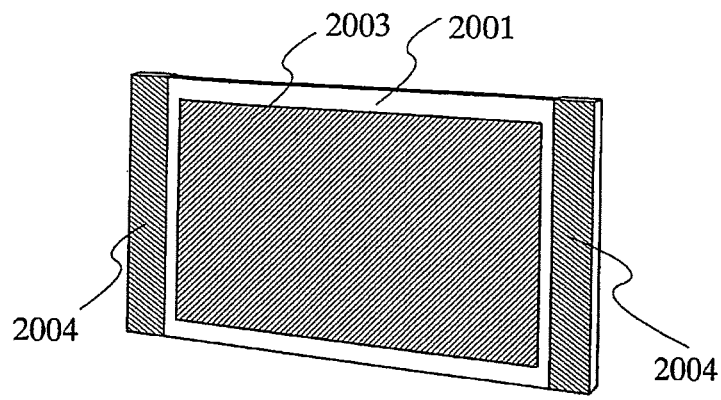
FIGS. 15A to 15E are diagrams illustrating electronic devices to which the present invention can be applied.

FIG. 15A is a light-emitting display device, to which a television set, a monitor of a personal computer, or the like corresponds, include a frame body 2001, a display portion 2003, a speaker portion 2004, and the like. Since the display portion 2003 is superior in heat resistance and can be driven with stability for a long period of time, the light-emitting display device according to the present invention is a light-emitting display device with high reliability. A pixel portion is preferably provided with a polarization plate or a circularly polarization plate in order to enhance the contrast. For example, it is preferable to provide films in the order corresponding to a ¼λ plate, a ½λ plate, and a polarization plate over a sealing substrate. Further, an anti-reflective film may be provided over the polarization plate.

Figures 15B, 15C:
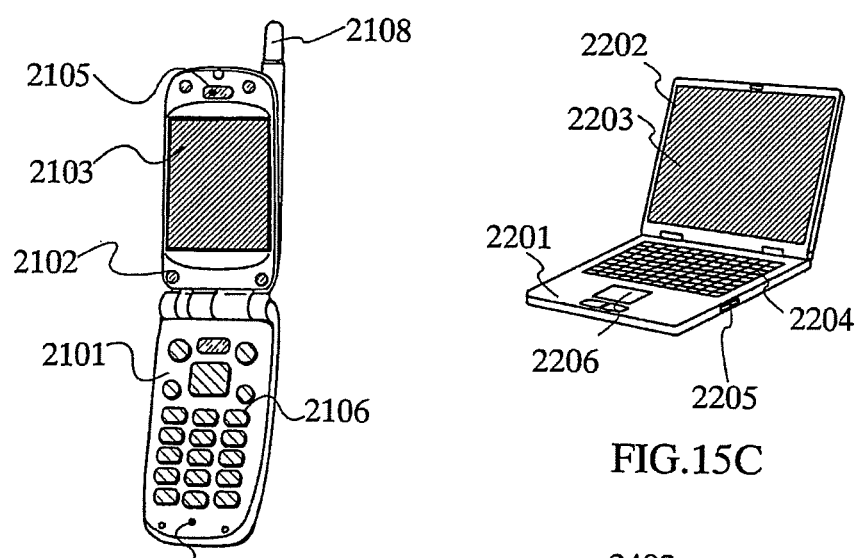

FIG. 15B is a cellular phone, which includes a main body 2101, a frame body 2102, a display portion 2103, a sound input portion 2104, a sound output portion 2105, an operation key 2106, an antenna 2108, and the like. Since the display portion 2103 is superior in heat resistance and can be driven with stability for a long period of time, the cellular phone according to the present invention is a cellular phone with high reliability.

FIG. 15C is a computer, which includes a main body 2201, a frame body 2202, a display portion 2203, a keyboard 2204, an external connection port 2205, a pointing mouse 2206, and the like. Since the display portion 2203 is superior in heat resistance and can be driven with stability for a long period of time, the computer according to the present invention is a computer with high reliability. In FIG. 15C, a laptop computer is shown as an example. However, the present invention can be applied to a desktop computer and the like.

Figures 15D, 15E:
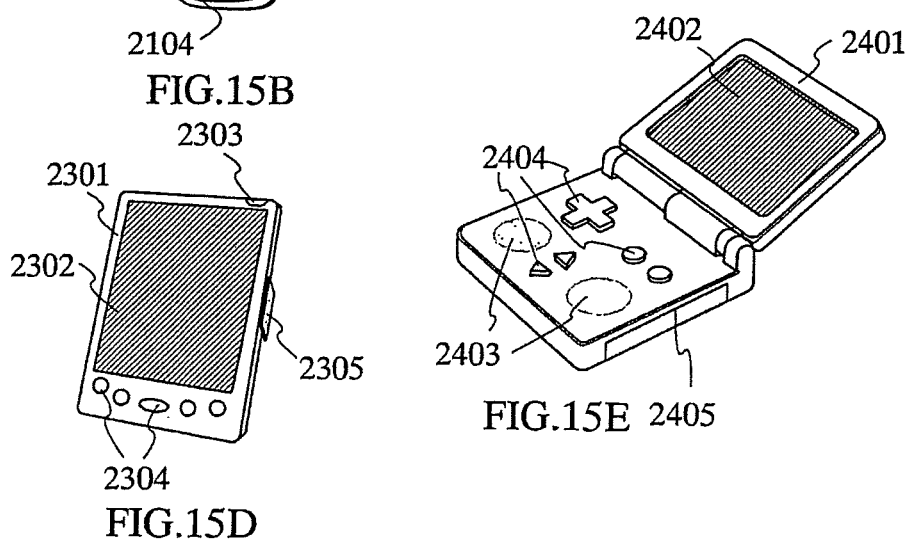

FIG. 15D is a mobile computer, which includes a main body 2301, a display portion 2302, a switch 2303, an operation key 2304, an infrared port 2305, and the like. Since the display portion 2303 is superior in heat resistance and can be driven with stability for a long period of time, the mobile computer according to the present invention is a mobile computer with high reliability.

FIG. 15E is a portable game machine, which includes a frame body 2401, a display portion 2402, a speaker portion 2403, operation keys 2404, a recording medium insert portion 2405, and the like. Since a light-emitting element in the display portion 2402 is superior in heat resistance and can be driven with stability for a long period of time, the portable game machine according to the present invention is a portable game machine with high reliability.

As described above, the present invention is capable of quite wide application, and can be thus used for electronic devices in all fields.

Embodiment Mode 13

Figure 16A:
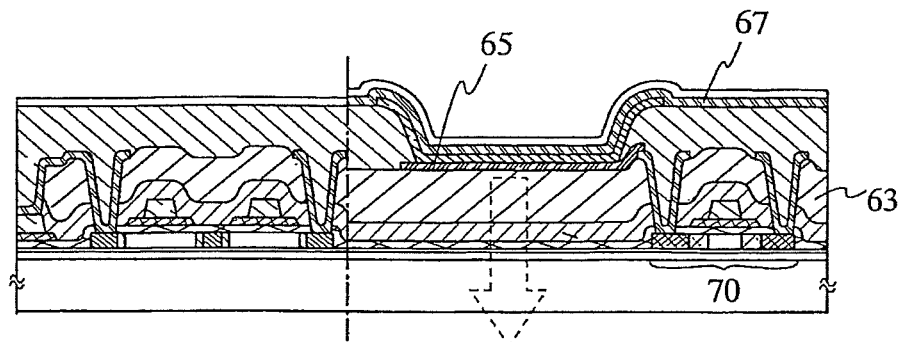
FIGS. 16A to 16C are diagrams illustrating the structure of display devices.
Figure 16B:
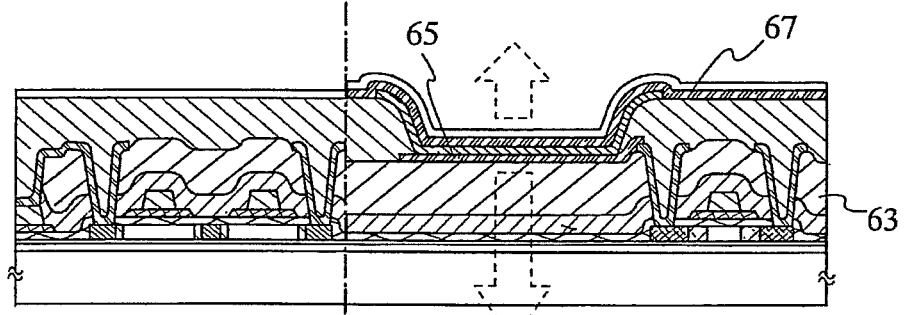
Figure 16C:
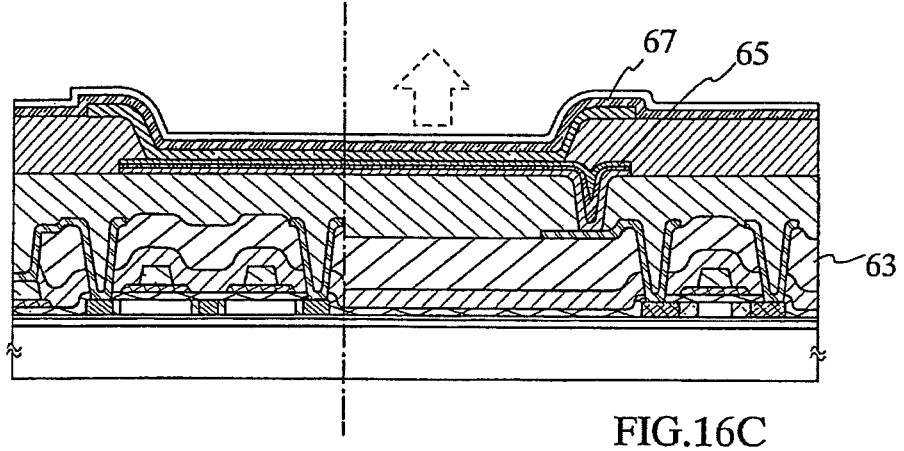

FIGS. 16A to 16C respectively show examples of bottom-emission, dual-emission (that is, both-emission of bottom-emission and top-emission), and top-emission devices. Each of FIGS. 16A and 16B shows a structure for the case of forming a first interlayer insulating layer 63 in FIG. 16C with the use of a self-flatness material and forming a wiring that is connected to a thin film transistor 70 and a first electrode 64 for a light-emitting element on the same interlayer insulating layer. In FIG. 16A, only the first electrode 64 for the light-emitting element is formed by using a light-transmitting material to provide a bottom-emission structure in which light is emitted toward the bottom of the light-emitting device. In the case of FIG. 16B, a bottom-emission light-emitting display device that is able to extract light from the both sides as shown in FIG. 16B can be obtained by using a light-transmitting material such as ITO, ITSO, or IZO also for a second electrode 67. It is to be noted that a material such as aluminum or silver, which is not light-transmitting in a thick film, gets to have a light-transmitting property when the thickness is made thinner. Therefore, also when the second electrode 67 is formed by using a film of aluminum or silver that is thin enough to have a light-transmitting property, a dual-emission device can be obtained.

Embodiment Mode 14

In the present embodiment, a pixel circuit and a protection circuit that are included in the panel or module described in Embodiment Mode 11 and operations thereof will be described. It is to be noted that the cross-sectional views shown in FIGS. 11A to 11E and FIGS. 12A to 12C correspond to cross-sectional views of a driving TFT 1403 and a light-emitting element 1405.

Figure 17A:
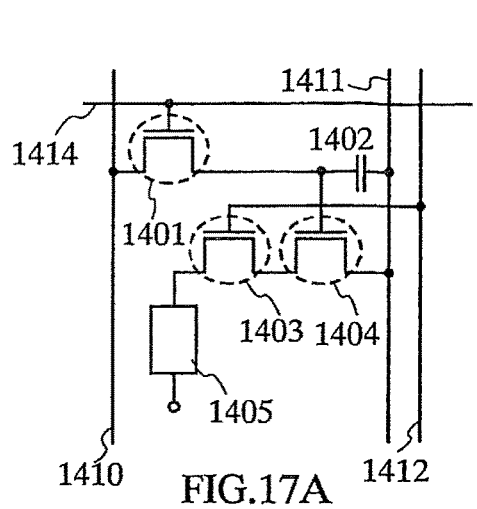
FIGS. 17A to 17F are diagrams illustrating examples of pixel circuits for a display device.

In the pixel shown in FIG. 17A, a signal line 1410, power supply lines 1411 and 1412 are arranged in a column direction, and a scan line 1414 is arranged in a row direction. The pixel also includes a switching TFT 1401, a driving TFT 1403, a current controlling TFT 1404, a capacitor 1402 and a light-emitting element 1405.

Figure 17B:
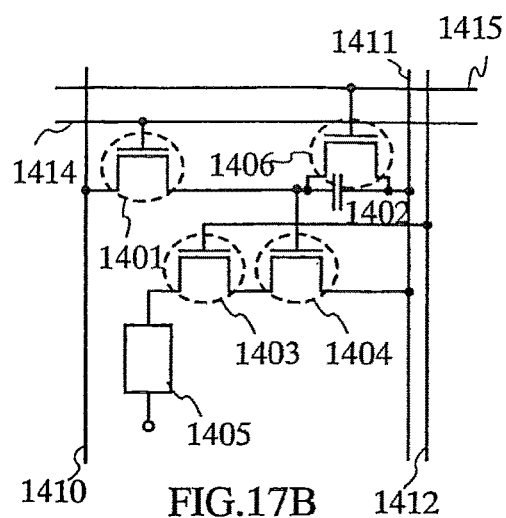
Figure 17C:
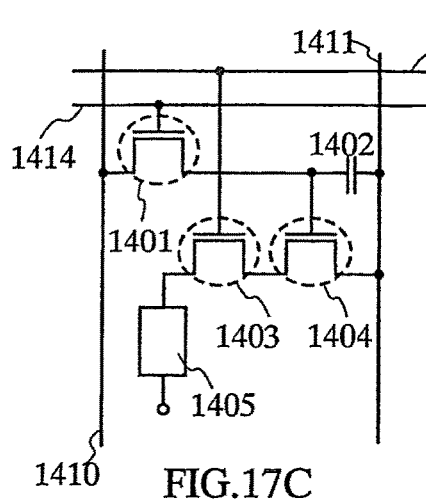
Figure 17D:
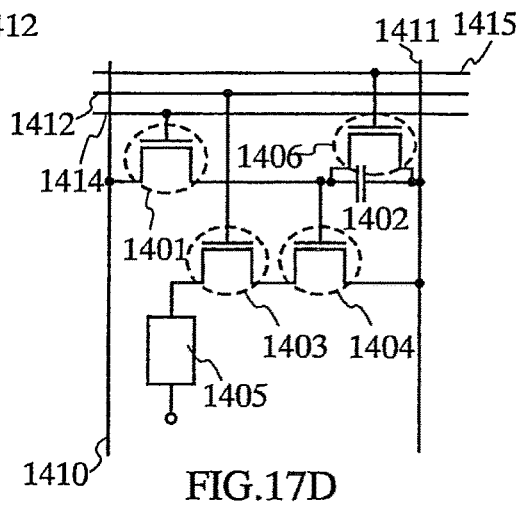

The pixel shown in FIG. 17C, which basically has the same structure as the pixel shown in FIG. 17A, is different only in that a gate electrode of a TFT 1403 is connected to a power supply line 1412 arranged in a row direction. Namely, each of FIGS. 17A and 17C illustrates the same equivalent circuit diagram. However, when the case of arranging the power supply line 1412 in the column direction (FIG. 17A) is compared to the case of arranging the power supply line 1412 in the row direction (FIG. 17C), each of the power supply lines is formed by using a conductive film of a different layer. In the present embodiment, attention is given to the wiring connected to the gate electrode of each driving TFT 1403, and FIGS. 17A and 17C are separately illustrated to indicate that the layers for forming these wirings are different from each other.

In each of the pixels shown in FIGS. 17A and 17C, the TFTs 1403 and 1404 are connected in series. It is preferable that the channel length L (1403) and channel width W (1403) of the TFT 1403 and the channel width L (1404) and channel width W (1404) of the TFT 1404 satisfy L (1403)/W (1403):L (1404)/W (1404)=5 to 6000:1.

It is to be noted that the TFT 1403 operates in the saturation region and functions to control a current value that is applied to the light-emitting element 1405 while the TFT 1404 operates in the linear region and functions to control current supply to the light-emitting element 1405. Both of the TFTs preferably have the same conductivity type in the light of the manufacturing steps, and are formed as N-channel TFTs in the present embodiment. For the TFT 1403, not only an enhancement mode TFT but also a depletion mode TFT may be used. According to the invention, which has the structure described above, the TFT 1404 operates in the linear region. Therefore, slight fluctuation in Vgs of the TFT 1404 has no influence on a current value that is applied to the light-emitting element 1405. Namely, the current value that is applied to the light-emitting element 1405 can be determined by the TFT 1403, which operates in the saturation region. The structure described above makes it possible to improve luminance unevenness of light-emitting elements due to variations in characteristics of TFTs so that a display device with enhanced image quality can be provided.

In each of the pixels shown in FIGS. 17A to 17D, the TFT 1401 controls input of a video signal to the pixel. When the TFT 1401 is turned ON, a video signal is input to the pixel. Then, the voltage of the video signal is held in the capacitor 1402. Although each of FIGS. 17A and 17C illustrates a structure in which the capacitor 1402 is provided, the invention is not limited to this. The capacitor 1402 may be omitted when a gate capacitance or the like can cover the capacitor for holding a video signal.

The pixel shown in FIG. 17B, which basically has the same pixel structure as FIG. 17A, is different only in that a TFT 1406 and a scan line 1415 are additionally provided. Similarly, the pixel shown in FIG. 17D, which basically has the same pixel structure as FIG. 17C, is different only in that the TFT 1406 and a scan line 1415 are additionally provided.

The switching (ON/OFF) of the TFT 1406 is controlled by the scan line 1415 provided additionally. When the TFT 1406 is turned ON, a charge held in the capacitor 1402 is discharged to turn OFF the TFT 1404. Namely, the arrangement of the TFT 1406 makes it possible to bring the light-emitting element 1405 forcibly into a state where no current flows thereto. Therefore, the TFT 1406 can be referred to as an erasing TFT. Thus, in the structures shown in FIGS. 17B and 17D, an emission period can be started simultaneously with or immediately after a writing period without waiting for completion of writing signals to all pixels, and thus, the duty ratio an be improved.

Figure 17E:
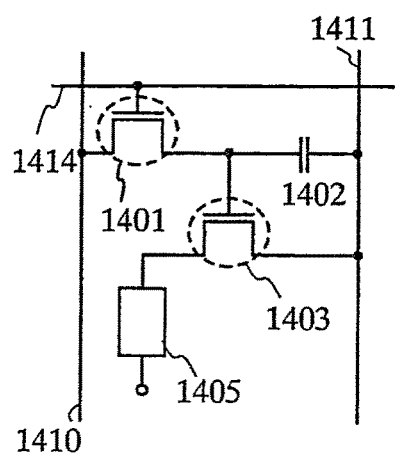
Figure 17F:
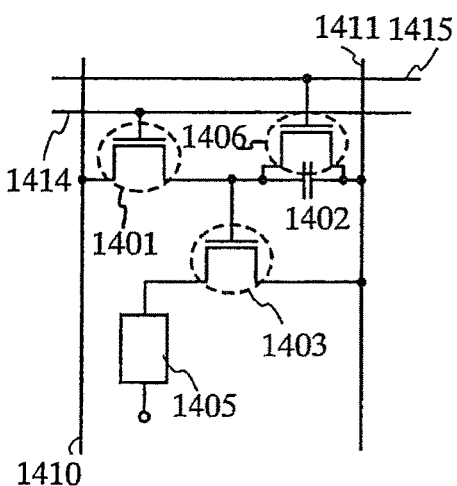

In the pixel shown in FIG. 17E, a signal line 1410 and a power supply line 1411 are arranged in a column direction, and a scan line 1414 is arranged in a row direction. The pixel also includes a switching TFT 1401, a driving TFT 1403, a capacitor 1402 and a light-emitting element 1405. The pixel shown in FIG. 17F, which basically has be same pixel structure as FIG. 17E, is different only in that a TFT 1406 and a scan line 1415 are additionally provided. Also in the structure shown in FIG. 17F, the arrangement of the TFT 1406 makes it possible to improve the duty ratio.

As described above, various pixel circuits can be employed. In particular, in the case of forming a thin film transistor by using an amorphous semiconductor film, it is preferable to make a semiconductor film for the driving TFT 1403 larger. Therefore, for the pixel circuit described above, it is preferable to employ a top emission type in which light from a light-emitting element is emitted from a sealing substrate side.

This active-matrix light-emitting device can be driven at a low voltage when the pixel density is increased since a TFT is provided in each pixel, and is thus considered to be advantageous.

In the present embodiment, an active-matrix light-emitting device in which a TFT is provided for each pixel is described. However, a passive-matrix light-emitting device in which a TFT is provided for each column can be also formed. The passive-matrix light-emitting device has a high aperture ratio since a TFT is not provided for each pixel. In the case of a light-emitting device in which luminescence is emitted to the both sides of a light-emitting element, the transmittance is increased when a passive-matrix light-emitting device is used.

A display device according to the present invention, which further includes a pixel circuit like these, can be a light-emitting device that has each of the features described above while a material that is suitable for the structure and required performance of a light-emitting element can be used for an electrode of the light-emitting element included in the display device.

Subsequently, a case of providing diodes as protection circuits for a scan line and a signal line will be described with reference to the equivalent circuit shown in FIG. 17E.

Figure 18:
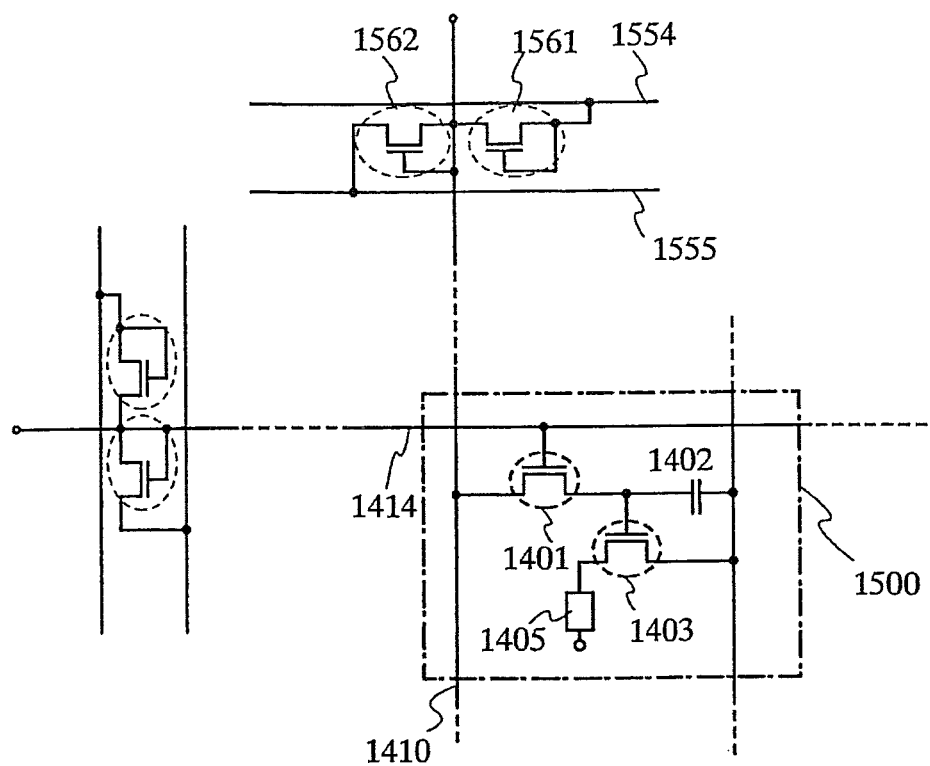
FIG. 18 is a diagram illustrating an example of a protection circuit for a display device.

In FIG. 18, switching TFTs 1401 and 1403 a capacitor 1402, and a light-emitting element 1405 are provided in a pixel portion 1500. For a signal line 1410, diodes 1561 and 1562 are provided. The diodes 1561 and 1562 are manufactured in accordance with the embodiment described above in the same way as the switching TFTs 1401 and 1403, and each of the diodes 1561 and 1562 includes a gate electrode, a semiconductor layer, a source electrode, and a drain electrode. Each of the diodes 1561 and 1562 operates as a diode by connecting the gate electrode to the drain electrode or the source electrode.

Common potential lines 1554 and 1555 that are respectively connected to the diodes 1561 and 1562 are formed by the same layer as the gate electrode. Accordingly, in order to be connected to the source electrode or drain electrode of each diode, it is necessary to form contact holes in a gate insulating layer.

Diodes that are provided for a scan line 1414 have the same structure.

As described above, a protective diode that is provided for an input state can be formed at the same time according to the present invention. It is to be noted that the position in which the protection diode is formed is not limited to this, and the protection circuit can be provided between a driver circuit and a pixel.

A display device according to the present invention, which has this protection circuit, is superior in heat resistance and can be driven with stability for a long period of time, and thus has high reliability. The reliability of the display device can be further enhanced by including the structure described above.

Embodiment

In the present example, an example of manufacturing the composite material according to the present invention will be specifically explained.

<<Manufacturing Sample of Example>>

[1. Preparation of Sol]

First, in a glove box in which the concentration of water is kept a few ppm or so, 0.156 g (0.50 mmol) of 5-diphenylamino-8-quinolinol (abbreviation: DPAq) was dissolved; and 0.122 g (0.50 mmol) of vanadium tri-iso-propoxide oxide was dropped. Next, 0.065 g (0.50 mmol) of ethyl acetoacetate was dropped as a stabilization agent, and stirring was carried out all night to obtain a sol.

[2. Manufacturing Composite Material According to the Present Invention]

Further, while the obtained sol was dropped on a quartz substrate through a filter of 0.45 µm, spin coating was carried out under conditions of 200 rpm for 2 seconds, and then, 3000 rpm for 70 seconds. Next, the spin-coated substrate and a beaker with pure water put therein were put in an electric furnace, and heated at 40° C. for 2 hours to carry out hydrolysis with water vapor. Further, the beaker with pure water put therein was taken out from the furnace, and the composite material according to the present invention was obtained by baking at 120° C. for 1.5 hours while reducing the pressure in the furnace by a rotary pump. In the composite material of the present example, the metal oxide skeleton is a vanadium oxide skeleton, and the organic compound that is bound to the metal of the metal oxide skeleton by forming a chelate is DPAq.

<<Manufacturing Comparative Sample>>

For comparison, a sol excluding DPAq from the sol for the example described above was prepared, and applied to a quartz substrate and baked under the same conditions mentioned above to manufacture a comparative sample. Namely, the comparative sample is a thin film of vanadium oxide since ethyl acetoacetate as a stabilization agent was during the baking.

<<Experimental Result>>

Figure 21A:
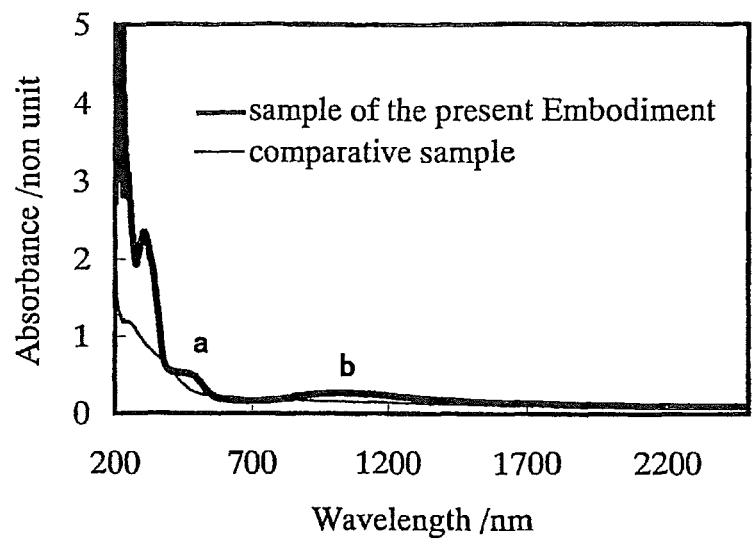
FIGS. 21A and 21B are absorption spectra of an example and a comparative example.

A spectrophotometer (from Hitachi, Ltd., U-400) was used to measure ultraviolet-visible-infrared absorption spectra of the sample of the present example and the comparative sample, which were manufactured as described above. FIG. 21A shows the result. Further, FIG. 21B shows an enlarged view of the spectra from the visible region to the near-infrared region (500 to 2000 nm).

Figure 21B:
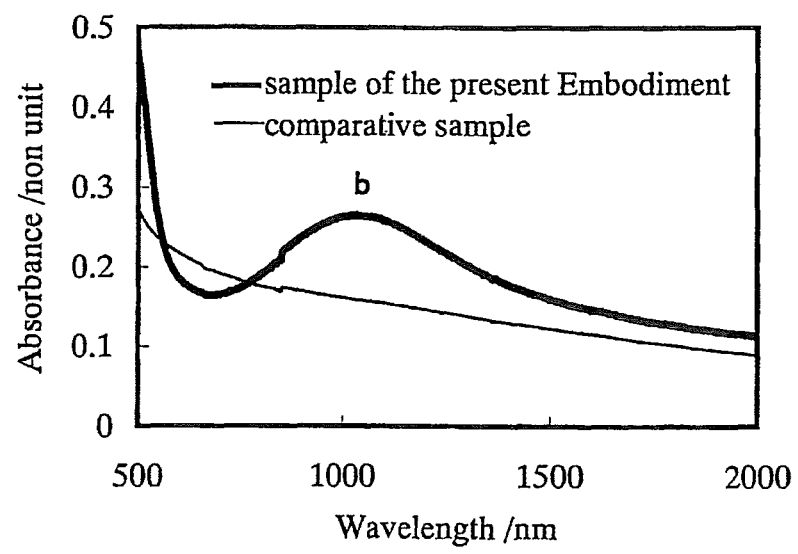

As shown in FIGS. 21A and 21B, it is determined that new absorption is observed around 480 nm (a in the figure) and around 1050 nm (b in the figure) in the spectrum of the sample of the present example. Since the absorption around 480 nm is observed when DPAq and an ion of a metal such as Ti or Al form a complex, the absorption is considered to be absorption due to a chelate produced by DPAq being bound to vanadium. On the other hand, the absorption around 1050 nm in the near infrared is an absorption band that is observed normally in a charge transfer complex (an electron donor-accepter complex), which suggests that charge transfer is carried out between DPAq and vanadium oxide. Since the diphenylamino group of DPAq normally has a high electron donating property, it is believed that DPAq and vanadium oxide are respectively an electron acceptor and an electron donor.

Further, in a sol-gel method, it is known that an oxide skeleton (a bond of metal-oxygen-metal) is formed by hydrolysis and baking. Namely, vanadium tri-iso-propoxide oxide forms a vanadium oxide skeleton. Accordingly, the example described above shows that it is possible to manufacture the composite material according to the present invention, including the metal oxide (vanadium oxide) skeleton and the organic compound (DPAq) that is bound to the metal atom (vanadium atom) of the metal oxide skeleton by forming a chelate, where the metal oxide exhibits an electron accepting property to the organic compound.

Although the present invention has been fully described by way of example with reference to the accompanying drawings, it is to be understood that various changes and modifications will be apparent to those skilled in the art. Therefore, unless such changes and modifications depart from the scope of the present invention hereinafter defined, they should be construed as being included therein.

The invention claimed is:

1. A composite material comprising:
a first metal oxide comprising a first metal atom selected from aluminum, gallium, or indium;
an organic compound that is bound to the first metal atom by forming a chelate;
a second metal oxide comprising a second metal atom selected from titanium, vanadium, molybdenum, tungsten, rhenium, ruthenium, or niobium; and
a third metal oxide,
wherein the second metal oxide exhibits an electron accepting property to the organic compound,
wherein the first metal oxide, the organic compound, the second metal oxide, and the third metal oxide are in a single layer, and
wherein the first metal oxide, the second metal oxide, and the third metal oxide form a composite oxide.

2. The composite material according to claim 1, wherein the organic compound has an arylamine skeleton.

3. The composite material according to claim 1, wherein the third metal oxide is silicon oxide.

4. A light-emitting element comprising a light-emitting layer including a luminescent material and a layer including the composite material according to claim 1 between a pair of electrodes.

5. The light-emitting element according to claim 4, wherein the layer including the composite material is in contact with any one or both of the pair of electrodes.

6. A light-emitting device comprising the light-emitting element according to claim 4.

7. The composite material according to claim 1, wherein the second metal oxide is vanadium oxide.

8. A composite material comprising:
a first metal oxide comprising a first metal atom selected from aluminum, gallium, or indium;
an organic compound that is bound to the first metal atom by forming a chelate;
a second metal oxide comprising a second metal atom selected from an alkali metal or an alkali earth metal; and
a third metal oxide,
wherein the second metal oxide exhibits an electron donating property to the organic compound,
wherein the first metal oxide, the organic compound, the second metal oxide, and the third metal oxide are in a single layer, and
wherein the first metal oxide, the second metal oxide, and the third metal oxide form a composite oxide.

9. The composite material according to claim 8, wherein the organic compound has any one or more of a pyridine skeleton, a pyrazine skeleton, a triazine skeleton, an imidazole skeleton, a triazole skeleton, an oxadiazole skeleton, a thiadiazole skeleton, an oxazole skeleton, and a thiazole skeleton.

10. The composite material according to claim 8, wherein the second metal atom is selected from lithium, calcium, or barium.

11. The composite material according to claim 8, wherein the third metal oxide is silicon oxide.

12. A light-emitting element comprising a light-emitting layer including a luminescent material and a layer including the composite material according to claim 8 between a pair of electrodes.

13. The light-emitting element according to claim 12, wherein the layer including the composite material is in contact with any one or both of the pair of electrodes.

14. A light-emitting device comprising the light-emitting element according to claim 12.

15. A composite material comprising:
a first metal oxide comprising a first metal atom;
an organic compound that is bound to the first metal atom by forming a chelate;
a second metal oxide comprising a second metal atom selected from titanium, vanadium, molybdenum, tungsten, rhenium, ruthenium, or niobium; and
a third metal oxide,
wherein the second metal oxide exhibits an electron accepting property to the organic compound,
wherein the first metal oxide, the organic compound, the second metal oxide, and the third metal oxide are in a single layer, and
wherein the first metal oxide, the second metal oxide, and the third metal oxide form a composite oxide.

16. The composite material according to claim 15, wherein the organic compound has an arylamine skeleton.

17. The composite material according to claim 15, wherein the third metal oxide is silicon oxide.

18. A light-emitting element comprising a light-emitting layer including a luminescent material and a layer including the composite material according to claim 15 between a pair of electrodes.

19. The light-emitting element according to claim 18, wherein the layer including the composite material is in contact with any one or both of the pair of electrodes.

20. A light-emitting device comprising the light-emitting element according to claim 18.

21. The composite material according to claim 15, wherein the second metal oxide is vanadium oxide.

* * * * *